(12) United States Patent
Jo et al.

(10) Patent No.: US 11,985,871 B2
(45) Date of Patent: May 14, 2024

(54) DISPLAY DEVICE AND METHOD OF MANUFACTURING SAME

(71) Applicant: LG Display Co., Ltd., Seoul (KR)

(72) Inventors: Yongsun Jo, Paju-si (KR); Woojung Byun, Paju-si (KR); Hangyu Jung, Paju-si (KR); Deuksoo Jung, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 341 days.

(21) Appl. No.: 17/128,929

(22) Filed: Dec. 21, 2020

(65) Prior Publication Data

US 2021/0202662 A1 Jul. 1, 2021

(30) Foreign Application Priority Data

Dec. 31, 2019 (KR) .......................... 10-2019-0179736

(51) Int. Cl.
*H10K 59/131* (2023.01)
*H10K 59/122* (2023.01)
*H10K 59/12* (2023.01)

(52) U.S. Cl.
CPC ......... *H10K 59/131* (2023.02); *H10K 59/122* (2023.02); *H10K 59/1201* (2023.02)

(58) Field of Classification Search
CPC ........... H01L 2227/323; H01L 27/3246; H01L 27/3248; H01L 27/3262; H01L 27/3276;
(Continued)

(56) References Cited

U.S. PATENT DOCUMENTS 8,329,523 B2 12/2012 Choi et al.
8,916,877 B2 12/2014 Yang et al.
(Continued)

FOREIGN PATENT DOCUMENTS

CN 101887186 A 11/2010
CN 108122536 A 6/2018
(Continued)

OTHER PUBLICATIONS

Taiwan Intellectual Property Administration, Office Action, TW Patent Application No. 109146279, dated Dec. 6, 2021, ten pages.
(Continued)

*Primary Examiner* — Amr A Awad
*Assistant Examiner* — Aaron Midkiff
(74) *Attorney, Agent, or Firm* — Fenwick & West LLP

(57) ABSTRACT

Provided are a display device and a method of manufacturing the display device, the display device including a substrate including a pixel area where a pixel is placed, and a wire area where wires connected to the pixel are placed, a first power line placed on the substrate, and through which driving power is applied to the pixel, an active layer including a first connection pattern, a second connection pattern, and a third connection pattern that are placed above the first power line in the wire area, the third connection pattern being connected to the first power line, and a first gate line connected to the first connection pattern, and a second gate line connected to the second connection pattern, the first gate line and the second gate line being placed on the active layer in the wire area, wherein the first to the third connection pattern are island-shaped electrodes.

16 Claims, 19 Drawing Sheets

(58) Field of Classification Search
CPC ............. H01L 51/5203; H01L 27/1222; H01L 27/127; H01L 27/00–156; H01L 29/00–945; H10K 59/1213; H10K 59/122; H10K 59/123; H10K 59/131; H10K 59/12–1315; H10K 59/00–95; H10K 50/805; H10K 51/131; H10K 59/10–19; H10K 59/80–88; H10K 71/00–861; H10K 2102/3026; H10K 59/1201; H10K 2102/341; H10K 59/1315; H05K 59/122; G02F 1/136204; G02F 1/136286

See application file for complete search history.

(56) References Cited

U.S. PATENT DOCUMENTS

| | | | |
|---|---|---|---|
| 10,692,426 | B2 | 6/2020 | Kim et al. |
| 10,777,141 | B2 | 9/2020 | Jeong et al. |
| 10,811,438 | B2 | 10/2020 | Choi |
| 11,315,963 | B2 | 4/2022 | Song et al. |
| 2010/0289023 | A1 | 11/2010 | Choi et al. |
| 2018/0122884 | A1* | 5/2018 | Yamazaki .......... H10K 59/1216 |
| 2018/0122888 | A1 | 5/2018 | Jung et al. |
| 2018/0151126 | A1 | 5/2018 | Jeong et al. |
| 2019/0164999 | A1 | 5/2019 | Choi |
| 2021/0005644 | A1* | 1/2021 | Song .................... H01L 27/1225 |
| 2021/0280660 | A1* | 9/2021 | Chen ................. H10K 59/1315 |
| 2022/0406876 | A1* | 12/2022 | Lee ........................ H01L 25/167 |

FOREIGN PATENT DOCUMENTS

| | | | | |
|---|---|---|---|---|
| CN | 109659350 | A | | 4/2019 |
| CN | 109841650 | A | | 6/2019 |
| CN | 110299322 | A | | 10/2019 |
| KR | 20200004482 | A | * 7/2018 ........... H01L 25/167 |
| KR | 10-2012-0119546 | A | | 10/2020 |
| TW | 201926672 | A | | 7/2019 |

OTHER PUBLICATIONS

China National Intellectual Property Administration, Notice of Allowance, Chinese Patent Application No. 202011526135.3, Jan. 4, 2024, five pages.

\* cited by examiner

DISPLAY DEVICE AND METHOD OF MANUFACTURING SAME

CROSS REFERENCE TO RELATED APPLICATIONS

The present application claims priority to Republic of Korea Patent Application No. 10-2019-0179736, filed on Dec. 31, 2019, the entire contents of which is incorporated herein for all purposes by this reference.

BACKGROUND

Field

The present disclosure relates to a display device and a method of manufacturing the same.

Description of the Related Art

Organic light-emitting elements (hereinafter, referred to as light-emitting elements) constituting an organic light-emitting diode display are self-luminous and do not require a separate light source, so that the thickness and the weight of the display device are reduced. In addition, the organic light-emitting diode display has high quality characteristics, such as low power consumption, high luminance, and a high response rate.

The display device displays images through multiple pixels. Each of the pixels emits light with luminance that corresponds to a data signal applied from a data driver through a data line when a gate signal is applied from a gate driver through a gate line.

The foregoing is intended merely to aid in the understanding of the background of the present disclosure, and is not intended to mean that the present disclosure falls within the purview of the related art that is already known to those skilled in the art.

SUMMARY

In embodiments of the present disclosure, circuit elements of pixels are formed in a state in which gate lines and a high-potential power line are electrically connected to each other on a substrate of a display panel and have an equipotential.

In embodiments of the present disclosure, afterwards, a connection pattern is cut to form a first gate line, a second gate line, and a high-potential power line that are separated from each other.

According to an embodiment, a display device may comprise: a substrate including a pixel area in which a pixel is placed, and a wire area in which wires connected to the pixel are placed, a first power line placed on the substrate, and through which driving power is applied to the pixel, an active layer including a first connection pattern, a second connection pattern, and a third connection pattern that are placed above the first power line in the wire area, the third connection pattern being connected to the first power line, and a first gate line connected to the first connection pattern, and a second gate line connected to the second connection pattern, the first gate line and the second gate line being placed on the active layer in the wire area.

The first, the second and the third connection patterns may be island-shaped electrodes.

The first power line may extend in a first direction, and the third connection pattern may have a shape of a bar that extends in a second direction perpendicular to the first direction.

The first gate line and the second gate line may be placed spaced apart from each other in the first direction, and may extend in the second direction, and the first connection pattern and the second connection pattern each may have a shape of a bar extending in the first direction.

Each of the first, the second and the third connection pattern may be provided with a first end that is connected to the first gate line, the second gate line, and the first power line respectively, and with a second end that is placed adjacent to the other connection patterns.

The first, the second and the third connection pattern may be placed between the first gate line and the second gate line.

The first connection pattern and the second connection pattern may be placed spaced apart from each other in the first direction, and the third connection pattern may be placed spaced apart from the first connection pattern and the second connection pattern in the first direction and the second direction.

The first gate line may have a region provided with a protrusion pattern protruding toward the first connection pattern, and an end of the protrusion pattern may be connected to the first connection pattern.

The second gate line may have a region provided with a protrusion pattern protruding toward the second connection pattern, and an end of the protrusion pattern may be connected to the second connection pattern.

The display device may further include: a bridge pattern connected to the first power line and the third connection pattern, wherein the first power line is electrically connected to the third connection pattern through the bridge pattern.

The bridge pattern may have a shape of a bar that extends from the third connection pattern to the first power line in the second direction.

The bridge pattern may have a shape of a bar that extends from the third connection pattern to the first power line in the second direction.

The display device may further include a buffer layer interposed between the first power line and the active layer, a gate insulation layer interposed between the active layer, and the first and the second gate lines, a passivation layer covering the first and the second gate lines, an overcoat layer covering the passivation layer, and an anode electrode placed on the overcoat layer in the pixel area.

The first connection pattern and the second connection pattern may be respectively connected to the first gate line and the second gate line through a first contact hole and a second contact hole penetrating the gate insulation layer, the third connection pattern may be connected to the bridge pattern through a third contact hole penetrating the gate insulation layer, and the bridge pattern may be connected to the first power line through a fourth contact hole penetrating the buffer layer and the gate insulation layer.

The display device may further include an emission layer covering the anode electrode, and a cathode electrode covering the emission layer.

The display device may further include, a bank layer placed on the overcoat layer, and covering an edge of the anode electrode, an emission layer formed in an exposed area of the anode electrode that is not covered by the bank layer, and a cathode electrode covering the bank layer and the emission layer.

According to an embodiment, a method of manufacturing a display device may include forming a first power line on a substrate; forming a buffer layer on the first power line, forming a connection pattern on the buffer layer, forming a gate insulation layer on the connection pattern, etching the gate insulation layer so as to form a first to a third contact hole that partially expose a first to a third area of the connection pattern, and etching the gate insulation layer and the buffer layer so as to form a fourth contact hole that partially exposes the first power line, forming, on the gate insulation layer, a first gate line connected to the connection pattern through the first contact hole, a second gate line connected to the connection pattern through the second contact hole, and a bridge pattern connected to the connection pattern through the third contact hole and connected to the first power line through the fourth contact hole, forming a passivation layer, and forming, by using an etchant, a via hole that penetrates through the passivation layer.

The via hole may be formed corresponding to at least one region of the connection pattern.

At the forming of the via hole, when the passivation layer is etched and is thus exposed to outside, the connection pattern is partially removed by the etchant in an area corresponding to the via hole.

The via hole may be formed corresponding to a node where the first to the third area of the connection pattern are connected.

According to the embodiments, before circuit elements (for example, transistors) of pixels are formed on a substrate, gate lines and a power line are made to have an equipotential, whereby it is possible to prevent damage caused by static electricity when the circuit elements are formed.

According to the embodiments, an additional process for preventing static electricity when the circuit elements are formed is not required, so that process efficiency can be increased and manufacturing cost can be reduced.

BRIEF DESCRIPTION OF THE DRAWINGS

The above and other objectives, features, and other advantages of the present disclosure will be more clearly understood from the following detailed description when taken in conjunction with the accompanying drawings.

DETAILED DESCRIPTION

Figure 1:
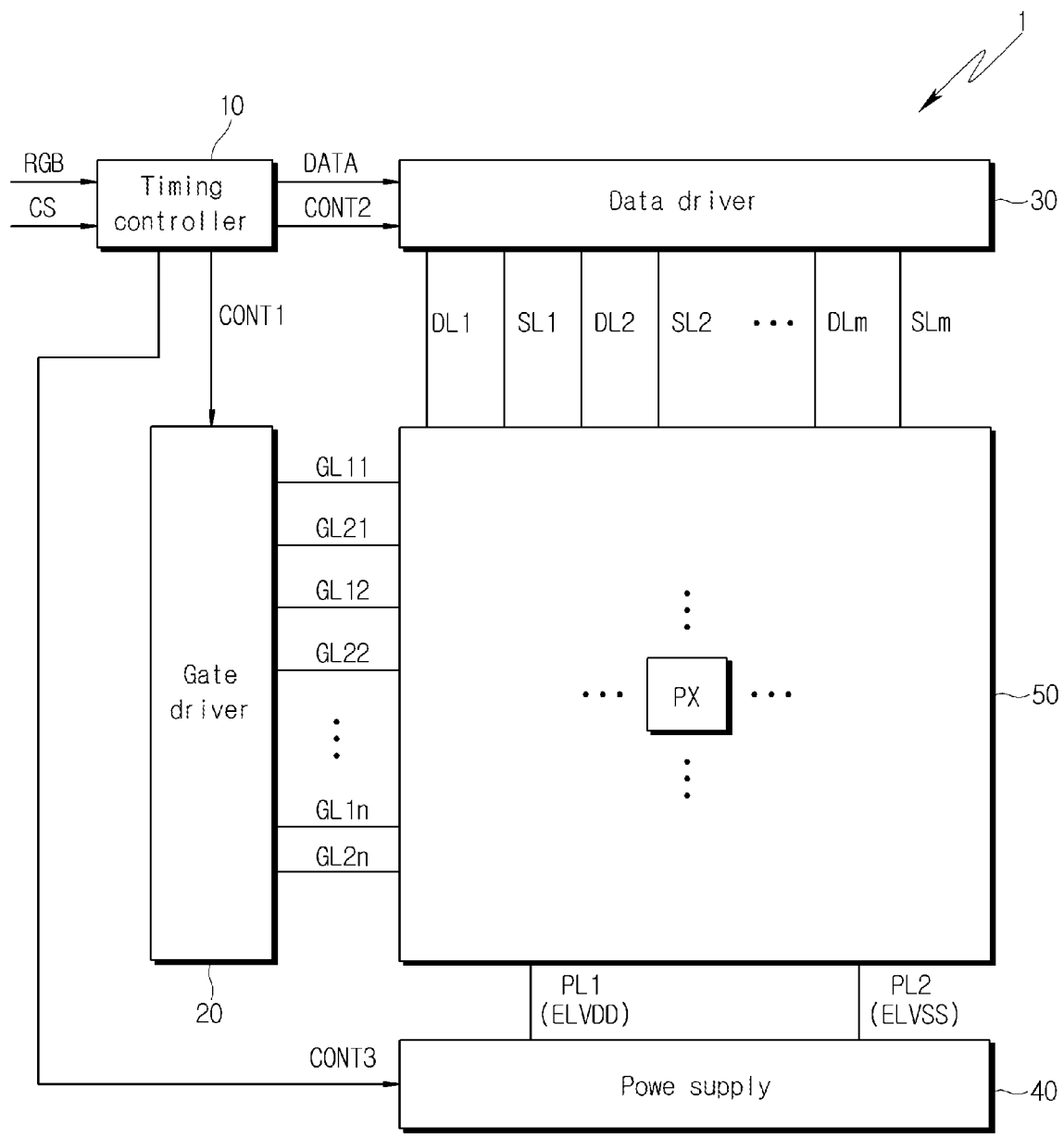
FIG. 1 is a block diagram showing a configuration of a display device according to an embodiment.

Hereinafter, embodiments will be described with reference to the accompanying drawings. In the specification, when an element (area, layer, part, or the like) is referred to as being "on", "coupled to", or "combined with" another element, it may be directly on/coupled to/combined with the other element or an intervening element may be present therebetween.

The same reference numerals refer to same elements. In the drawings, the thicknesses, ratios, and sizes of the elements are exaggerated for effective description of the technical details. The term "and/or" includes one or more combinations that the associated elements may define.

Terms "first", "second", etc. can be used to describe various elements, but the elements are not to be construed as being limited to the terms. The terms are only used to differentiate one element from other elements. For example, the "first" element may be named the "second" element without departing from the scope of the embodiments, and the "second" element may also be similarly named the "first" element. As used herein, the singular forms "a", "an", and "the" are intended to include the plural forms as well, unless the context clearly indicates otherwise.

The terms "under", "below", "on", "above", and the like are used herein for describing relationship between one or more elements shown in the drawings. These terms are relative concepts and are described on the basis of the direction in the drawings.

It is to be understood that terms such as "including", "having", etc. are intended to indicate the existence of the features, numbers, steps, actions, elements, components, or combinations thereof disclosed in the specification, and are not intended to preclude the possibility that one or more other features, numbers, steps, actions, elements, components, or combinations thereof may exist or may be added.

FIG. 1 is a block diagram showing a configuration of a display device according to an embodiment.

Referring to FIG. 1, a display device 1 includes a timing controller 10, a gate driver 20, a data driver 30, a power supply 40, and a display panel 50.

The timing controller 10 may receive an image signal RGB and a control signal CS from outside. The image signal RGB may include grayscale data. The control signal CS may include, for example, a horizontal synchronization signal, a vertical synchronization signal, and a main clock signal.

The timing controller 10 may process the image signal RGB and the control signal CS to make the signals appropriate for an operation condition of the display panel 50, so that the timing controller 10 may generate and output image data DATA, a gate driving control signal CONT1, a data driving control signal CONT2, and a power supply control signal CONT3.

The gate driver 20 may be connected to pixels (or subpixels) PXs of the display panel 50 through multiple first gate lines GL11 to GL1n. The gate driver 20 may generate gate signals on the basis of the gate driving control signal CONT1 output from the timing controller 10. The gate driver 20 may provide the generated gate signals to the pixels PXs through the multiple first gate lines GL11 to GL1n.

In various embodiments, the gate driver 20 may be further connected to the pixels PXs of the display panel 50 through multiple second gate lines GL21 to GL2n. The gate driver 20 may provide a sensing signal to the pixels PXs through the multiple second gate lines GL21 to GL2n. The sensing signal may be supplied so as to measure a characteristic of a driving transistor and/or a light-emitting element provided inside the pixels PXs.

The data driver 30 may be connected to the pixels PXs of the display panel 50 through multiple data lines DL1 to DLm. The data driver 30 may generate data signals on the basis of the image data DATA and the data driving control signal CONT2 output from the timing controller 10. The data driver 30 may provide the generated data signals to the pixels PXs through the multiple data lines DL1 to DLm.

In various embodiments, the data driver 30 may be further connected to the pixels PXs of the display panel 50 through multiple sensing lines (or reference lines) SL1 to SLm. The data driver 30 may provide a reference voltage (a sensing voltage, or an initialization voltage) to the pixels PXs through the multiple sensing lines SL1 to SLm, or may sense states of the pixels PXs on the basis of an electrical signal fed back from the pixels PXs.

The power supply 40 may be connected to the pixels PXs of the display panel 50 through multiple power lines PL1 and PL2. The power supply 40 may generate a driving voltage to be provided to the display panel 50, on the basis of the power supply control signal CONT3. The driving voltage may include, for example, a high-potential driving voltage ELVDD and a low-potential driving voltage ELVSS. The power supply 40 may provide the generated driving voltages ELVDD and ELVSS to the pixels PXs, through the corresponding power lines PL1 and PL2.

In the display panel 50, the multiple pixels PXs (or referred to as subpixels) are arranged. The pixels PXs may be, for example, arranged in a matrix form on the display panel 50.

Each of the pixels PXs may be electrically connected to the corresponding gate line and the corresponding data line. Such pixels PXs may emit light with luminance corresponding to the gate signals and the data signals that are supplied through the first gate lines GL11 to GL1*n* and the data lines DL1 to DLm, respectively.

Each pixel PX may display any one among a first to a third color. In an embodiment, each pixel PX may display any one among red, green, and blue colors. In another embodiment, each pixel PX may display any one among cyan, magenta, and yellow colors. In various embodiments, the pixels PXs may be constructed to display any one among four or more colors. For example, each pixel PX may display any one among red, green, blue, and white colors.

The timing controller 10, the gate driver 20, the data driver 30, and the power supply 40 may be constructed as separate integrated circuits (ICs), or ICs in which at least some thereof are integrated. For example, at least one among the data driver 30 and the power supply 40 may be constructed as an integrated circuit integrated with the timing controller 10.

In addition, in FIG. 1, the gate driver 20 and the data driver 30 are shown as elements separate from the display panel 50, but at least one among the gate driver 20 and the data driver 30 may be constructed in an in-panel manner that is formed being integrated with the display panel 50. For example, the gate driver may be formed being integrated with the display panel 50 according to a gate-in-panel (GIP) manner.

Figure 2:
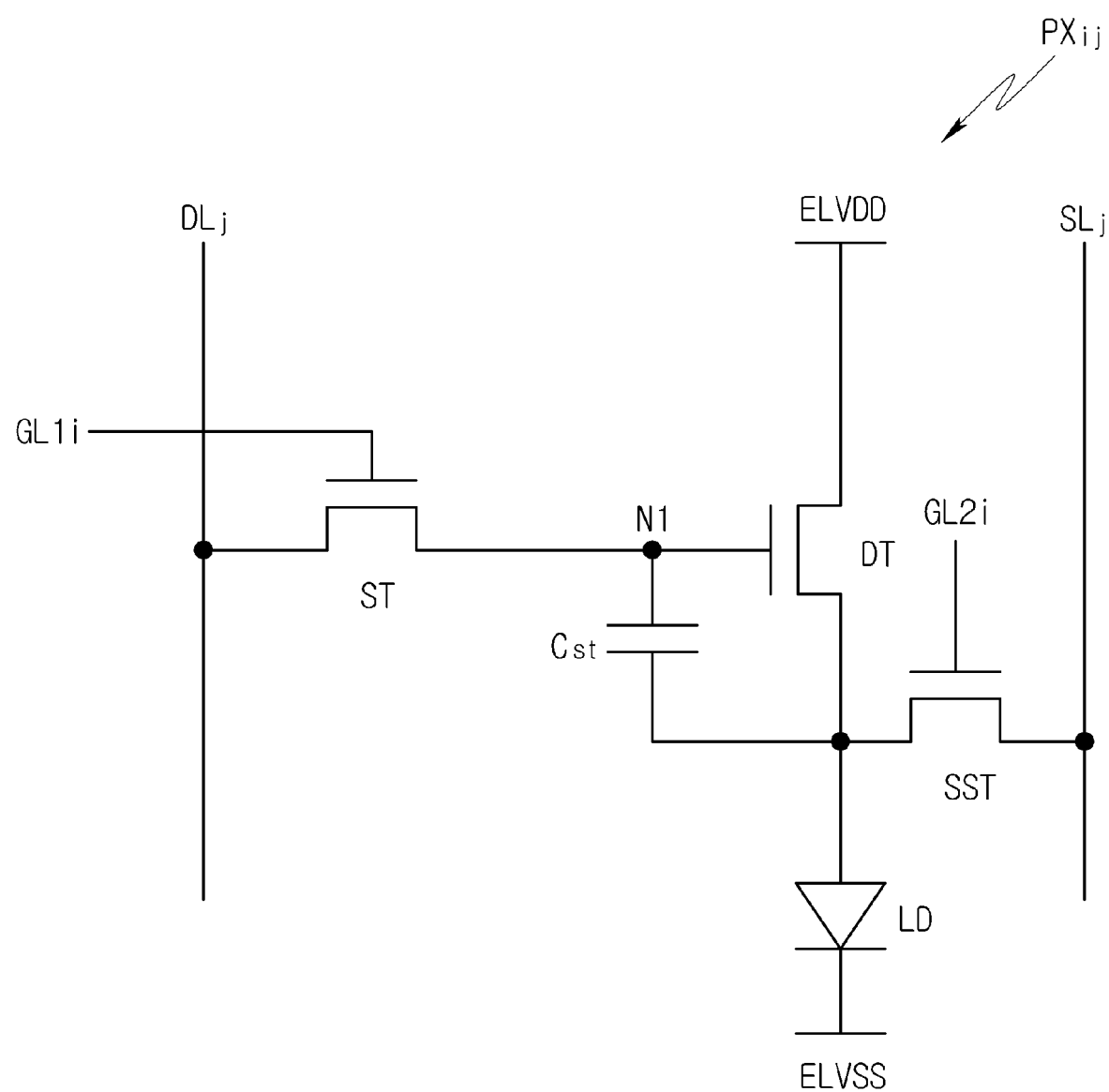
FIG. 2 is a circuit diagram showing an embodiment of a pixel shown in FIG. 1.

FIG. 2 is a circuit diagram showing an embodiment of the pixel shown in FIG. 1. FIG. 2 shows, as an example, a pixel PX*ij* that is connected to an i-th first gate line GL1*i* and a j-th data line DL*j*.

Referring to FIG. 2, a pixel PX includes a switching transistor ST, a driving transistor DT, a sensing transistor SST, a storage capacitor Cst, and a light-emitting element LD.

A first electrode (for example, a source electrode) of the switching transistor ST is electrically connected to the j-th data line DL*j*, and a second electrode (for example, a drain electrode) of the switching transistor ST is electrically connected to a first node N1. A gate electrode of the switching transistor ST is electrically connected to the i-th first gate line GL1*i*. The switching transistor ST is turned on when a gate signal at a gate-on level is applied through the i-th first gate line GL1*i*, and transmits a data signal applied through the j-th data line DL*j*, to the first node N1.

A first electrode of the storage capacitor Cst is electrically connected to the first node N1, and a second electrode of the storage capacitor Cst receives a high-potential driving voltage ELVDD. The storage capacitor Cst may be charged with a voltage corresponding to the difference between a voltage applied to the first node N1 and the high-potential driving voltage ELVDD.

A first electrode (for example, a source electrode) of the driving transistor DT receives the high-potential driving voltage ELVDD, and a second electrode (for example, a drain electrode) of the driving transistor DT is electrically connected to a first electrode (for example, an anode electrode) of the light-emitting element LD. A gate electrode of the driving transistor DT is electrically connected to the first node N1. The driving transistor DT is turned on when a voltage at a gate-on level is applied through the first node N1, and may control the amount of a driving current flowing to the light-emitting element LD depending on a voltage provided to the gate electrode, that is, a voltage stored in the storage capacitor Cst.

A first electrode (for example, a source electrode) of the sensing transistor SST is electrically connected to a j-th sensing line SL*j*, and a second electrode (for example, a drain electrode) of the sensing transistor SST is electrically connected to the first electrode (for example, the anode electrode) of the light-emitting element LD. A gate electrode of the sensing transistor SST is electrically connected to an i-th second gate line GL2*i*. The sensing transistor SST is turned on when a sensing signal at a gate-on level is applied through the i-th second gate line GL2*i*, and transmits a reference voltage applied through the j-th sensing line SL*j*, to the anode electrode of the light-emitting element LD.

The light-emitting element LD outputs light corresponding to the driving current. The light-emitting element LD may output light corresponding to any one among red, green, and blue colors. The light-emitting element LD may be an organic light-emitting diode (OLED) or an ultra-small inorganic light-emitting diode having a size in a micro to nanoscale range, but the present disclosure is not limited thereto. Hereinafter, embodiments in which the light-emitting element LD is an organic light-emitting diode will be described.

In the present disclosure, the structure of the pixels PXs is not limited to that shown in FIG. 2. According to an embodiment, the pixels PXs may further include at least one element for compensating for a threshold voltage of the driving transistor DT, or initializing a voltage of the gate electrode of the driving transistor DT and/or a voltage of the anode electrode of the light-emitting element LD.

FIG. 2 shows an example in which the switching transistor ST, the driving transistor, and the sensing transistor SST are NMOS transistors, but the present disclosure is not limited thereto. For example, at least some or all of the transistors constituting each pixel PX may be PMOS transistors. In various embodiments, each of the switching transistor ST, the driving transistor DT, and the sensing transistor SST may be implemented as a low-temperature polycrystalline silicon (LIPS) thin-film transistor, an oxide thin-film transistor, or a low-temperature polycrystalline oxide (LTPO) thin-film transistor.

Figure 3:
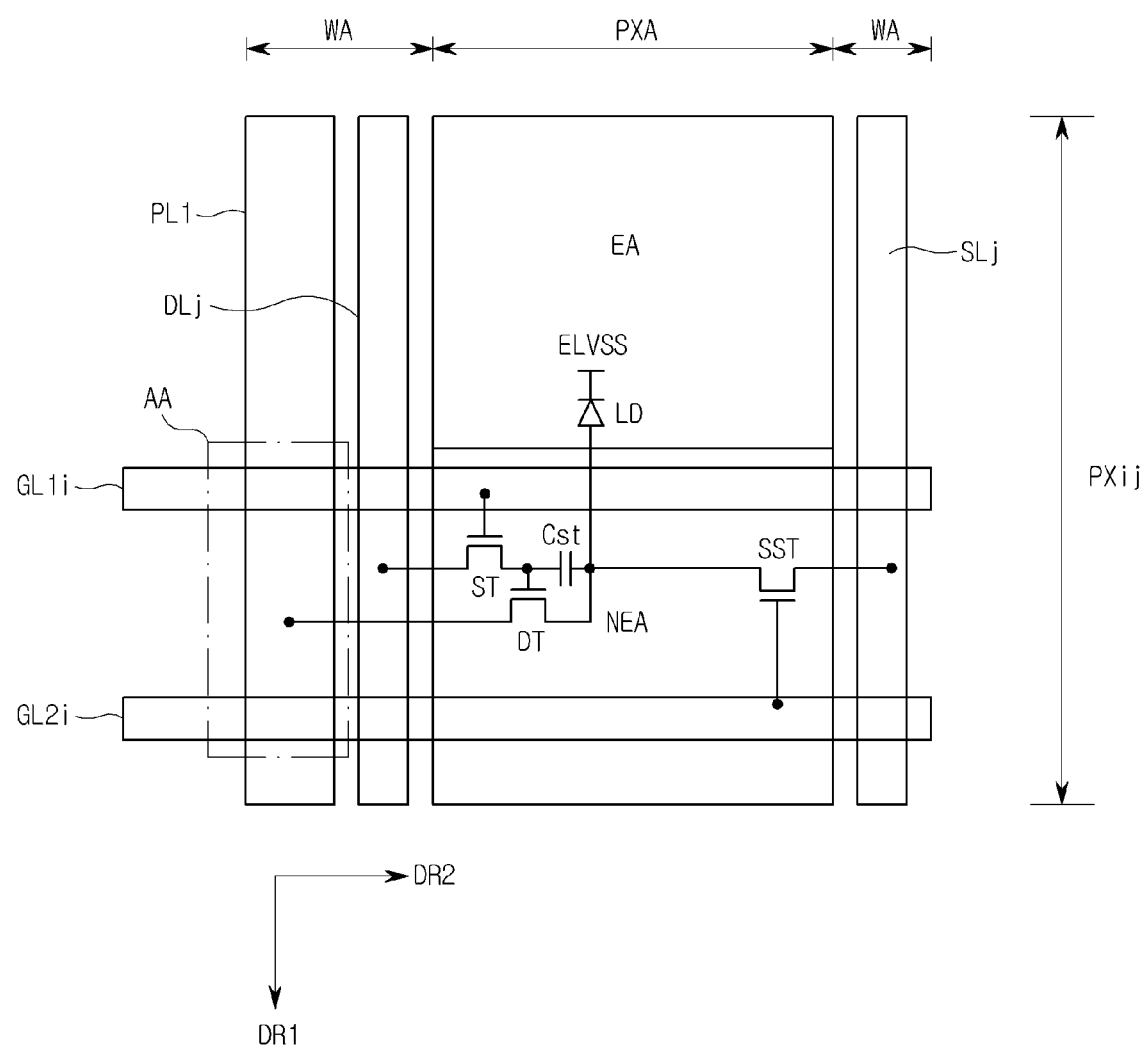
FIG. 3 is a diagram schematically showing a plane layout of a pixel according to an embodiment.

FIG. 3 is a diagram showing a plane layout of a pixel according to an embodiment.

Referring to FIGS. 2 and 3 together, the display panel 50 includes pixel areas PXAs defined at intersection regions of the data lines (DL*j*), which extend in a first direction (for example, a pixel column direction DR1), and the first and the second gate lines (GL1*i* and GL2*i*), which extend in a second direction (for example, a pixel row direction DR2). The pixels PXs are arranged in the respective pixel areas PXAs.

Each of the pixel areas PXA may include an emission area EA, and a non-emission area NEA. In the emission area EA, the light-emitting element LD of the pixel PX is placed. In the non-emission area NEA, circuit elements (for example, a switching transistor ST, a driving transistor DT, a sensing transistor SST, and a storage capacitor Cst) for driving the light-emitting element LD are placed. The light-emitting element LD is driven by the circuit elements placed in the non-emission area NEA and emits light in a particular color.

Wire areas WAs may be defined between pixel columns. In each of the wire areas WAs, the data line DLj and the sensing line SLj that extend in the first direction DR1 are placed. The data line DLj may receive a data signal from the data driver 30. The sensing line SLj may receive a reference voltage from the data driver 30, or may transmit an electrical signal output from the corresponding pixel PX, to the data driver 30.

In an embodiment, in some of the wire areas WAs, a first power line PL1 (high-potential potential) for applying the high-potential driving voltage ELVDD to the pixels PXs may be further formed. The first power line PL1 may extend in the first direction DR1 substantially parallel to the data line DLj and the sensing line SLj. In an embodiment, one first power line PL1 may be placed per multiple pixel columns. In this embodiment, the first power line PL1 may be connected to the pixels placed in multiple pixel columns, through an extended pattern (not shown) extending in a pixel row direction, namely, the second direction DR2.

The first gate line GL1i and the second gate line GL2i extend in the second direction DR2, across the non-emission area NEA. Herein, the first gate line GL1i and the second gate line GL2i may be arranged at regular intervals along the first direction DR1.

The data line DLj, the sensing line SLj, the first power line PL1, the first gate line GL1i, and the second gate line GL2i are electrically connected to the circuit elements through a contact hole. Specifically, the data line DLj may be electrically connected to an electrode (for example, a source electrode) of the switching transistor ST, and the sensing line SLj may be electrically connected to an electrode (for example, a source electrode) of the sensing transistor SST. The first gate line GL1i is electrically connected to gate electrodes of the switching transistor ST, and the second gate line GL2i is electrically connected to the gate electrode of the sensing transistor SST.

In general, the display panel 50 is manufactured by stacking wires and electrodes of the circuit elements on the substrate in order. For example, the display panel 50 may be manufactured by stacking the first power line PL1 and the data line DLj on the substrate and forming thereon the gate lines GL1i and GL2i and the electrodes of the circuit elements. When the electrodes of the circuit elements are formed, the electrodes are electrically connected to the first power line PL1 and the data line DLj through a contact hole. In addition, the electrodes may be integrated with the gate lines GL1i and GL2i as one pattern.

Herein, if the first power line PL1 and the gate lines GL1i and GL2i have different potentials, static electricity, or the like may occur and damage the circuit element. In order to prevent that problem, at the step of manufacturing the display panel 50, the first power line PL1 and the gate lines GL1i and GL2i are electrically connected to each other so as to have an equipotential, and are electrically separated after circuit elements are formed. Hereinafter, the display panel 50 manufactured as described above and a method of manufacturing the display panel 50 will be described in detail.

Figure 4:
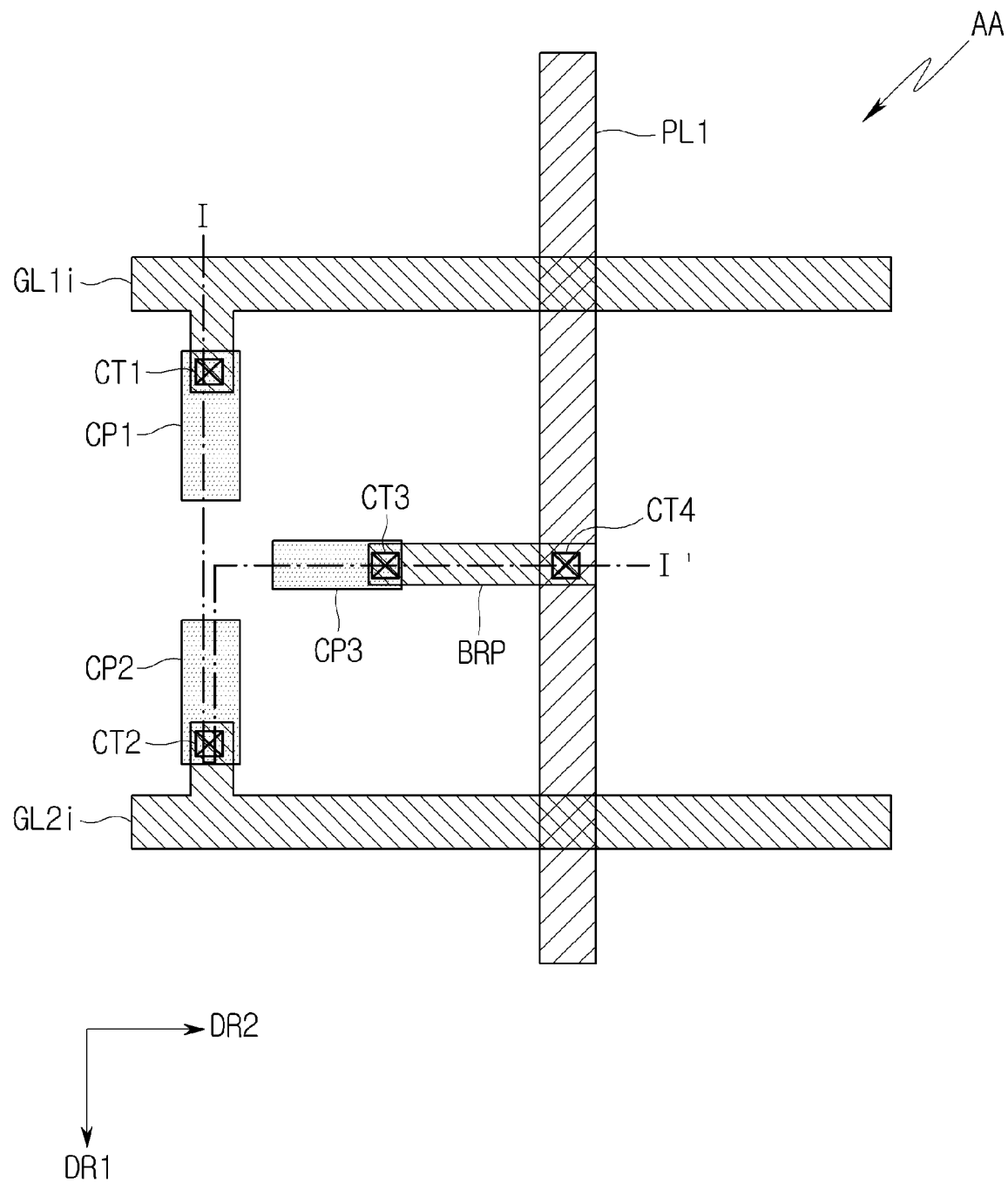
FIG. 4 is an enlarged view of an embodiment of area AA of FIG. 3 according to an embodiment.
Figure 5:
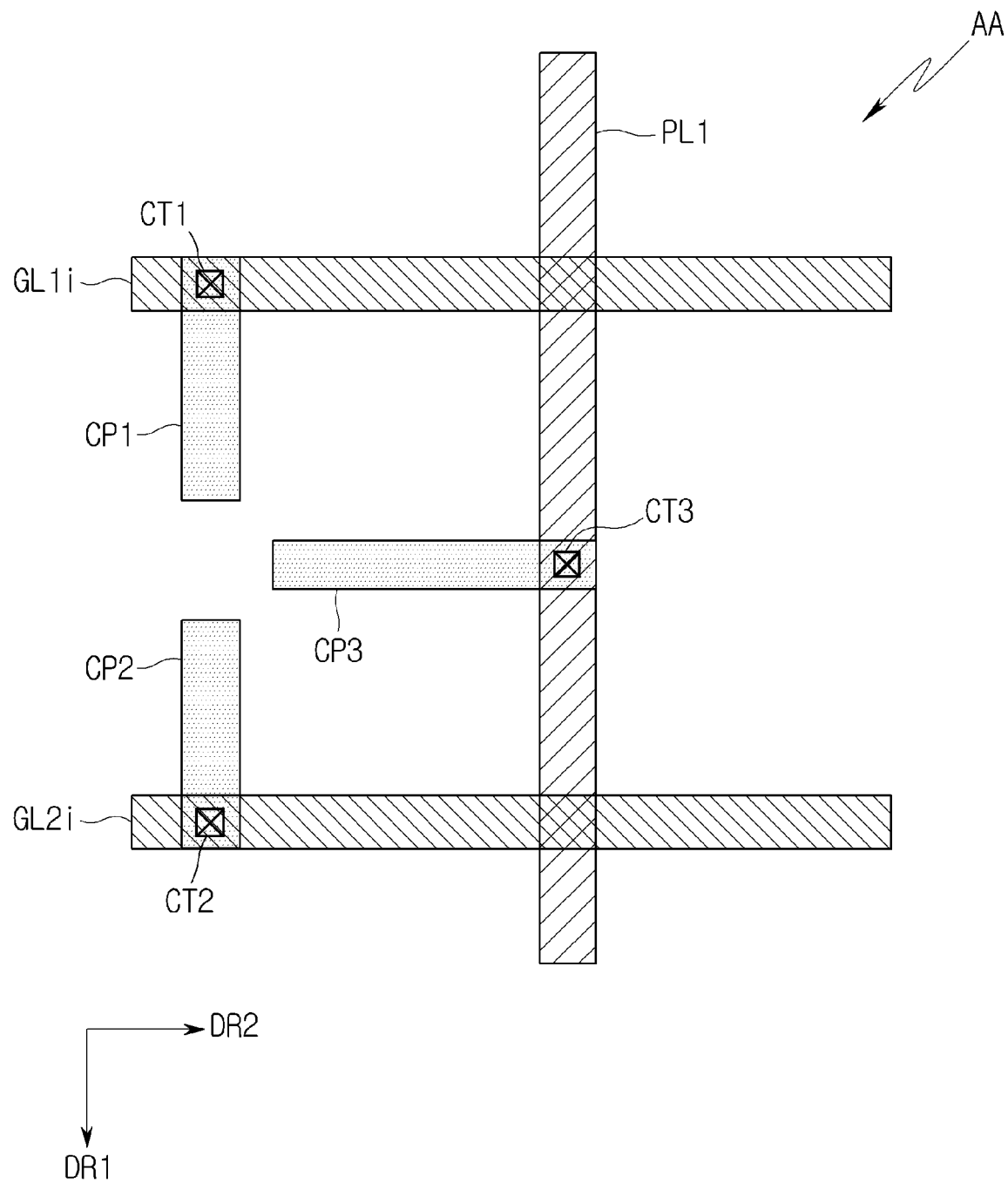
FIG. 5 is an enlarged view of another embodiment of area AA of FIG. 3.

FIG. 4 is an enlarged view of area AA of FIG. 3 according to one embodiment. FIG. 5 is an enlarged view of another embodiment of area AA of FIG. 3. FIGS. 4 and 5 shows area AA after manufacturing the display panel 50 is completed according to one embodiment.

Referring to FIG. 4, the first power line PL1 extends in the first direction DR1 in a wire area WA. The first gate line GL1i and the second gate line GL2i extend from the wire area WA in the second direction DR2, across the non-emission area NEA. The first gate line GL1i and the second gate line GL2i intersect the first power line PL1 in the wire area WA.

The first gate line GL1i may be connected to a first connection pattern CP1 through a first contact hole CT1. The first connection pattern CP1 may be an island-shaped electrode that has a shape of a bar extending substantially perpendicular to the first gate line GLi. However, the shape of the first connection pattern CP1 is not limited thereto. The first connection pattern CP1 may be placed between the first gate line GL1i and the second gate line GL2i.

In an embodiment, at least one region of the first gate line GL1i is provided with a protrusion pattern protruding in the first direction DR1, and the protrusion pattern may be connected to the first connection pattern CP1 through the first contact hole CT1. However, the form of connection between the first gate line GL1i and the first connection pattern CP1 is not limited thereto. That is, in another embodiment, the first gate line GL1i is not provided with a protrusion pattern as shown in FIG. 5, and the first gate line GL1i may be connected to the first connection pattern CP1 through the first contact hole CT1 in a region where the first gate line GL1i and the first connection pattern CP1 intersect.

The second gate line GL2i may be connected to a second connection pattern CP2 through a second contact hole CT2. The second connection pattern CP2 may be an island-shaped electrode that has a shape of a bar extending substantially perpendicular to the second gate line GL2i. However, the shape of the second connection pattern CP2 is not limited thereto.

The second connection pattern CP2 may be placed between the first gate line GL1i and the second gate line GL2i and spaced apart from the first connection pattern CP1 in the first direction DR1. Herein, the second connection pattern CP2 and the first connection pattern CP1 may be arranged in a line with respect to the first direction DR1.

In an embodiment, at least one region of the second gate line GL2i is provided with a protrusion pattern that protrudes in a direction opposite to the first direction DR1, and the protrusion pattern may be connected to the second connection pattern CP2 through the second contact hole CT2. However, the form of connection between the second gate line GL2i and the second connection pattern CP2 is not limited thereto. That is, in another embodiment, the second gate line GL2i is not provided with a protrusion pattern as shown in FIG. 5, and the second gate line GL2i may be connected to the second connection pattern CP2 through the second contact hole CT2 in a region where the second gate line GL2i and the second connection pattern CP2 intersect.

The first power line PL1 may be electrically connected to the third connection pattern CP3. The third connection pattern CP3 may be an island-shape electrode that has a shape of a bar extending substantially perpendicular to the first power line PL1. The third connection pattern CP3 may be placed between the first gate line GL1i and the second gate line GL2*i* and spaced apart from the first connection pattern CP1 and the second connection pattern CP2 by a predetermined distance in the first direction DR1 and the second direction DR2.

In an embodiment, the first power line PL1 may be electrically connected to the third connection pattern CP3 via a bridge pattern BRP. The bridge pattern BRP may be provided with a first end that is connected to the third connection pattern CP3 through the third contact hole CT3, and may be provided with a second end that is connected to the first power line PL1 through a fourth contact hole CT4. The bridge pattern BRP may have a shape of a bar extending in the second direction DR2. However, the shape of the bridge pattern BRP is not limited thereto. That is, in another embodiment, without going through the bridge pattern BRP as shown in FIG. 5, the first power line PL1 may be directly connected to the third connection pattern CP3 through the third contact hole CT3 in a region where the first power line PL1 and the third connection pattern CP3 intersect.

Hereinafter, a method of manufacturing the display panel 50 that has the above-described structure in the wire area WA will be described in detail.

FIGS. 6 to 19 are diagrams illustrating a method of manufacturing a display device according to an embodiment. Herein, FIGS. 7, 9, 11, 13, and 15 to 17 are cross-sectional views taken along line I-I' of FIGS. 6, 9, 10, and 12, respectively, according to embodiments of the present disclosure.

Figure 6:
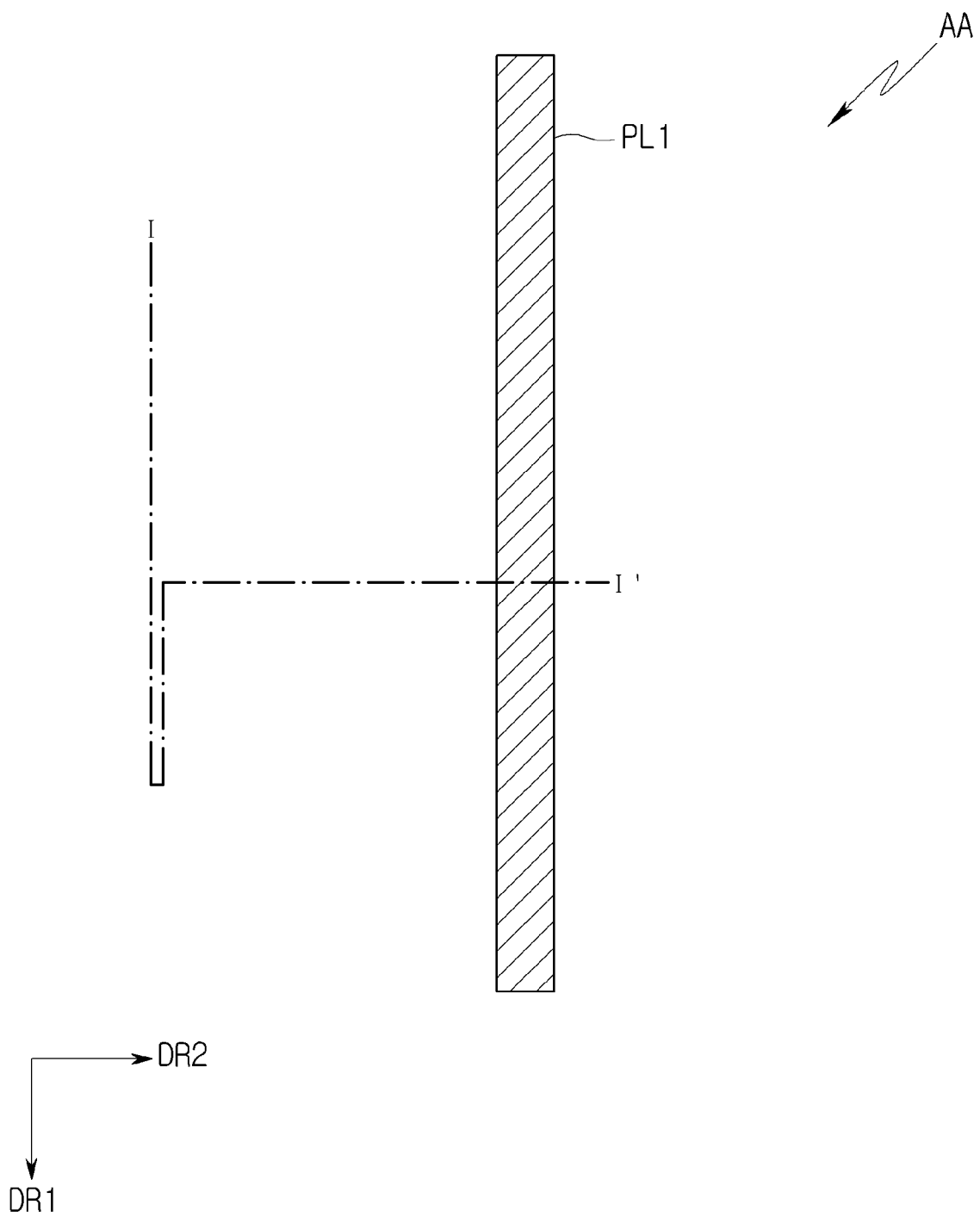
FIGS. 6 to 19 are diagrams illustrating a method of manufacturing a display device according to an embodiment.
Figure 7:
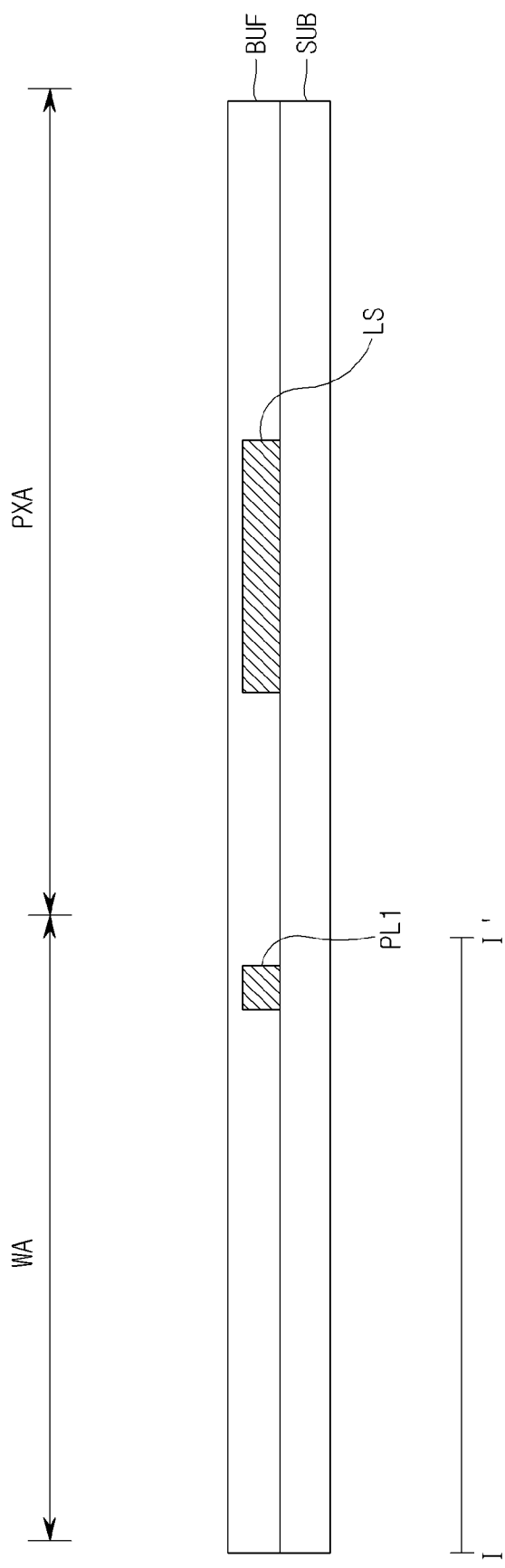

Referring to FIGS. 6 and 7, a substrate SUB is a base member of the display panel 50, and may be a light-transmissive substrate. The substrate SUB may be a rigid substrate including glass or tempered glass, or may be a flexible substrate made of a plastic material. For example, the substrate SUB may be made of a plastic material, such as polyimide, polyethylene terephthalate (PET), polyethylene naphthalate (PEN), polycarbonate (PC), and the like. However, the material of the substrate SUB is not limited thereto.

On the substrate SUB, a pixel area PXA and a wire area WA surrounding the pixel area PXA are defined. The pixel area PXA is an area including at least one circuit element placed at a circuit element layer, and a light-emitting element LD placed at a light-emitting element layer. The at least one circuit element and the light-emitting element LD placed in the pixel area PXA may constitute one pixel PX. The wire area WA is an area where wires through which a driving signal and power for driving the pixel PX are applied are placed.

On the substrate SUB, a first conductive layer may be placed. The first conductive layer may include the first power line PL1 placed in the wire area WA, and a light-shielding layer LS placed in the pixel area PXA. The first power line PL1 is formed in a shape that extends in the first direction DR1 on the substrate SUB. The light-shielding layer LS is placed in such a manner as to be overlapped by a semiconductor pattern of the driving transistor DT, particularly, a channel CH when viewed from above, and may thus protect the oxide semiconductor device from external light.

In various embodiments, the first conductive layer may further include wires (for example, the data line DLj and the sensing line SLj placed in the wire area WA) and/or electrodes that are not shown.

A buffer layer BUF is placed on the substrate SUB so as to cover the first conductive layer. The buffer layer BUF may prevent diffusion of ions or impurities from the substrate SUB, and may block moisture penetration. In addition, the buffer layer BUF may enhance the flatness of the surface of the substrate SUB. The buffer layer BUF may include an inorganic material, such as an oxide, a nitride, and the like, an organic material, or an organic-inorganic compound. The buffer layer BUF may be formed in a single-layer or multi-layer structure. For example, the buffer layer BUF may have a structure of three or more layers of silicon oxide, silicon nitride, and silicon oxide in that order. In another embodiment, the buffer layer BUF may be omitted.

Figure 8:
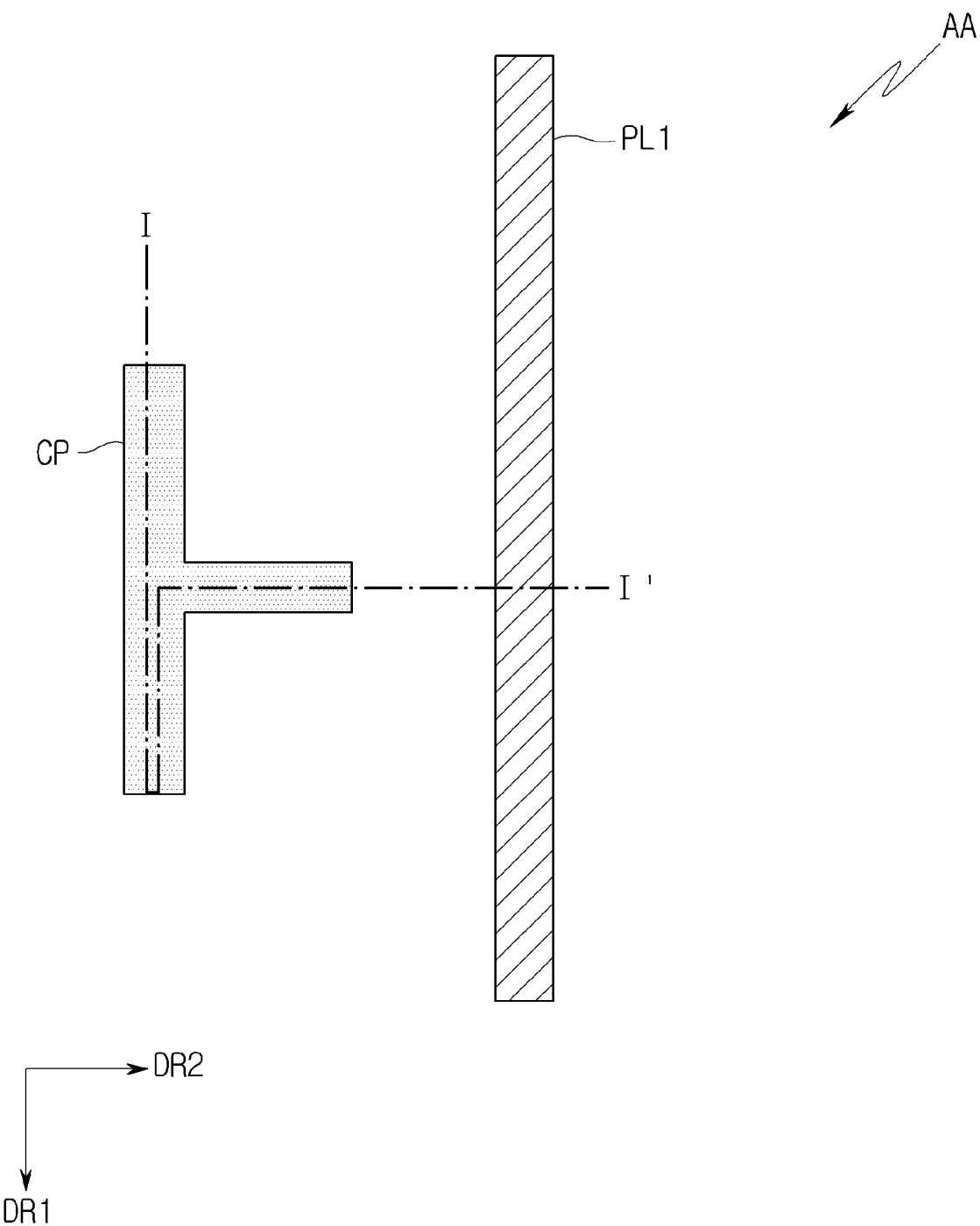
Figure 9:
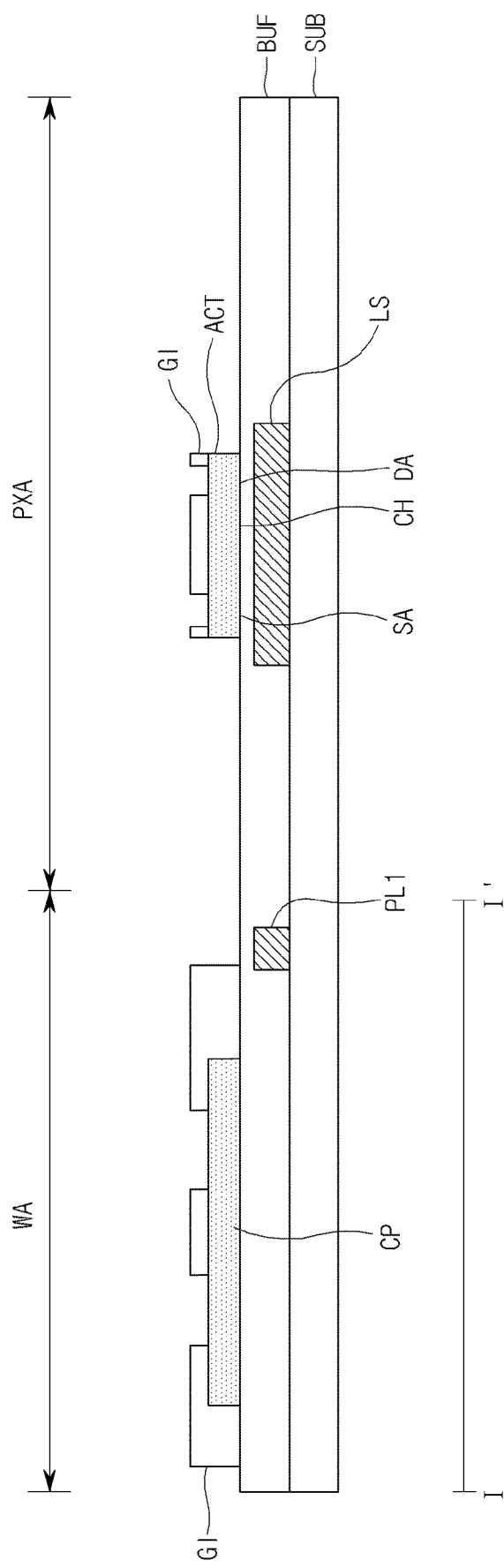

Referring to FIGS. 8 and 9, an active layer ACT may be formed on the buffer layer BUF. The active layer ACT may be made of a silicon-based semiconductor material or an oxide-based semiconductor material. As the silicon-based semiconductor material, amorphous silicon or polycrystalline silicon may be used. As the oxide-based semiconductor material, a quaternary metal oxide, such as an indium tin gallium zinc oxide (InSnGaZnO); a ternary metal oxide, such as an indium gallium zinc oxide (InGaZnO), an indium tin zinc oxide (InSnZnO), an indium aluminum zinc oxide (InAlZnO), a tin gallium zinc oxide (SnGaZnO), an aluminum gallium zinc oxide (AlGaZnO), or a tin aluminum zinc oxide (SnAlZnO); or a binary metal oxide, such as an indium zinc oxide (InZnO), a tin zinc oxide (SnZnO), an aluminum zinc oxide (AlZnO), a zinc magnesium oxide (ZnMgO), a tin magnesium oxide (SnMgO), an indium magnesium oxide (InMgO), an indium gallium oxide (InGaO), an indium oxide (InO), a tin oxide (SnO), or a zinc oxide (ZnO), may be used.

In the wire area WA, the active layer ACT may include a connection pattern CP. The connection pattern CP may be placed spaced apart from an area where the first gate line GL1*i* is to be placed, from an area where the second gate line GL2*i* is to be placed, and from the first power line PL1. The connection pattern CP may include extended parts that extend toward the area where the first gate line GL1*i* is to be placed, toward the area where the second gate line GL2*i* is to be placed, and toward the first power line PL1.

In the pixel area PXA, the active layer ACT may include a source area SA and a drain area DA containing p-type or n-type impurities, and a channel CH formed between the source area SA and the drain area DA.

On the active layer ACT, a gate insulation layer GI may be formed. The gate insulation layer GI may be a silicon oxide (SiOx), a silicon nitride (SiNx), or multiple layers of a silicon oxide (SiOx) and a silicon nitride (SiNx), for insulation between the active layer ACT and a second conductive layer, which will be described later.

Figure 10:
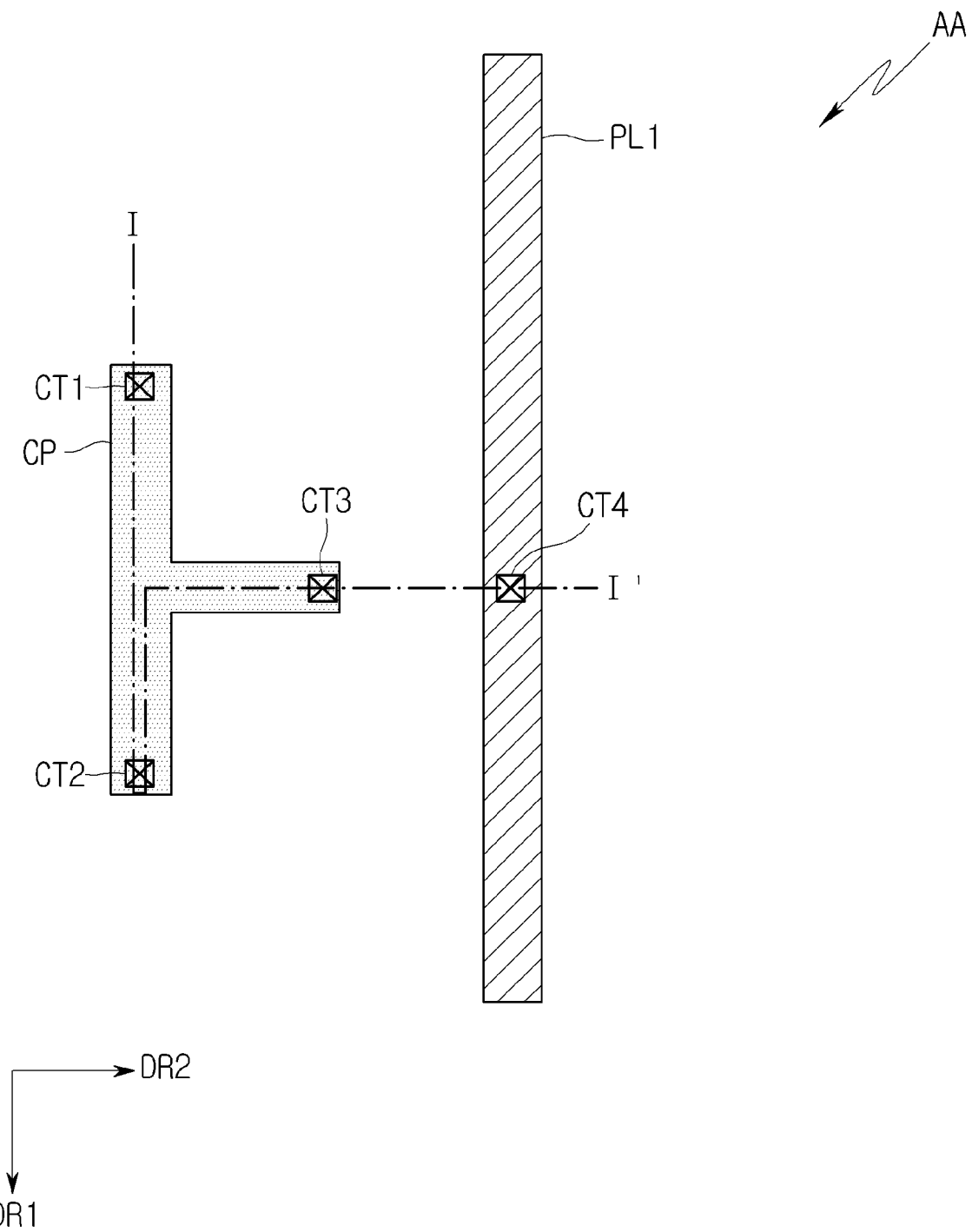
Figure 11:
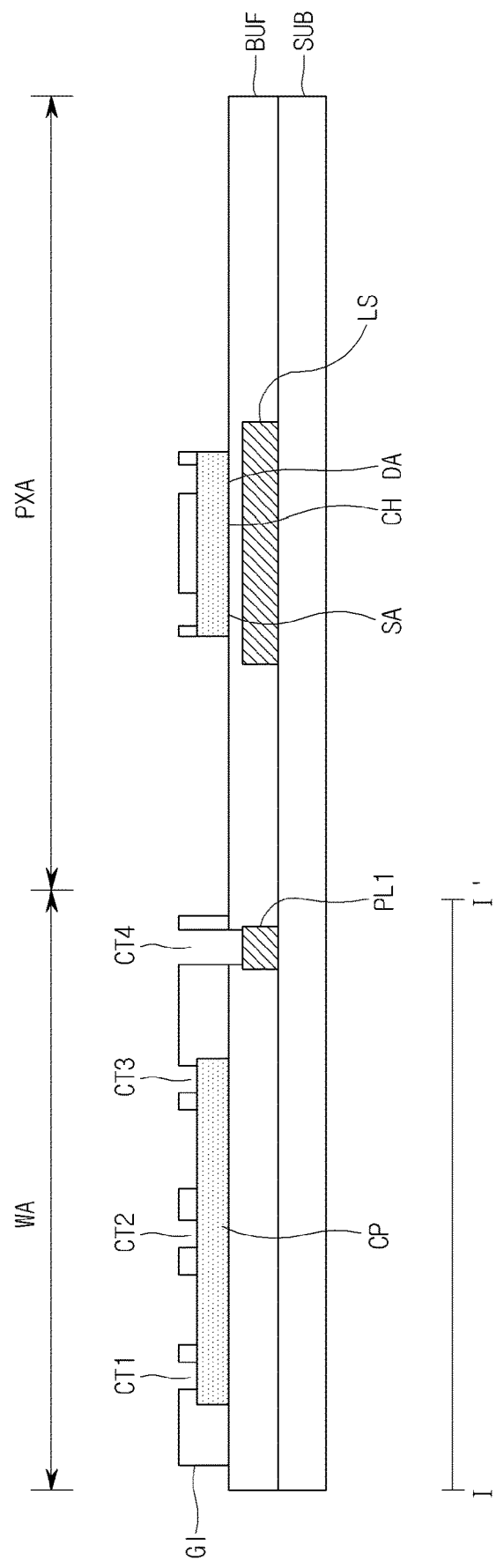

Referring to FIGS. 10 and 11, the contact holes CT1, CT2, CT3, and CT4 may be formed to electrically connect the second conductive layer, which is formed later, to the first conductive layer and the active layer ACT. In order for some contact holes CT1, CT2, and CT3 of the contact holes CT1, CT2, CT3, and CT4 to electrically connect the second conductive layer and the active layer ACT, the gate insulation layer GI is etched and a region of the active layer ACT is thus exposed to the outside. In order for the remaining contact hole CT4 among the contact holes CT1, CT2, CT3, and CT4 to electrically connect the second conductive layer and the first conductive layer, the gate insulation layer GI and the buffer layer BUF are etched and a region of the first conductive layer is thus exposed to the outside.

In this embodiment, the first contact hole CT1 is for connecting the first gate line GL1*i* and the connection pattern CP, and may be formed in the extended part of the connection pattern CP that is placed in the direction of the first gate line GL1*i*. In an embodiment, the first contact hole CT1 may be formed in an area where the extended part intersects an area where an extended pattern of the first gate line GL1i is to be formed.

The second contact hole CT2 is for connecting the second gate line GL2i and the connection pattern CP, and may be formed in the extended part of the connection pattern CP that is placed in the direction of the second gate line GL2i. In an embodiment, the second contact hole CT2 may be formed in an area where the extended part overlaps with an area where an extended pattern of the second gate line GL2i is to be formed.

The third contact hole CT3 is for connecting the first power line PL1 and the bridge pattern BRP. The third contact hole CT3 may be formed in an area where the extended part of the connection pattern CP that is placed in the direction of the first power line PL1 overlaps with an area where the bridge pattern BRP is to be formed.

The fourth contact hole CT4 is for connecting the first power line PL1 and the bridge pattern BRP. The fourth contact hole CT4 may be formed in an area where the first power line PL1 intersects an area where the bridge pattern BRP is to be formed.

Figure 12:
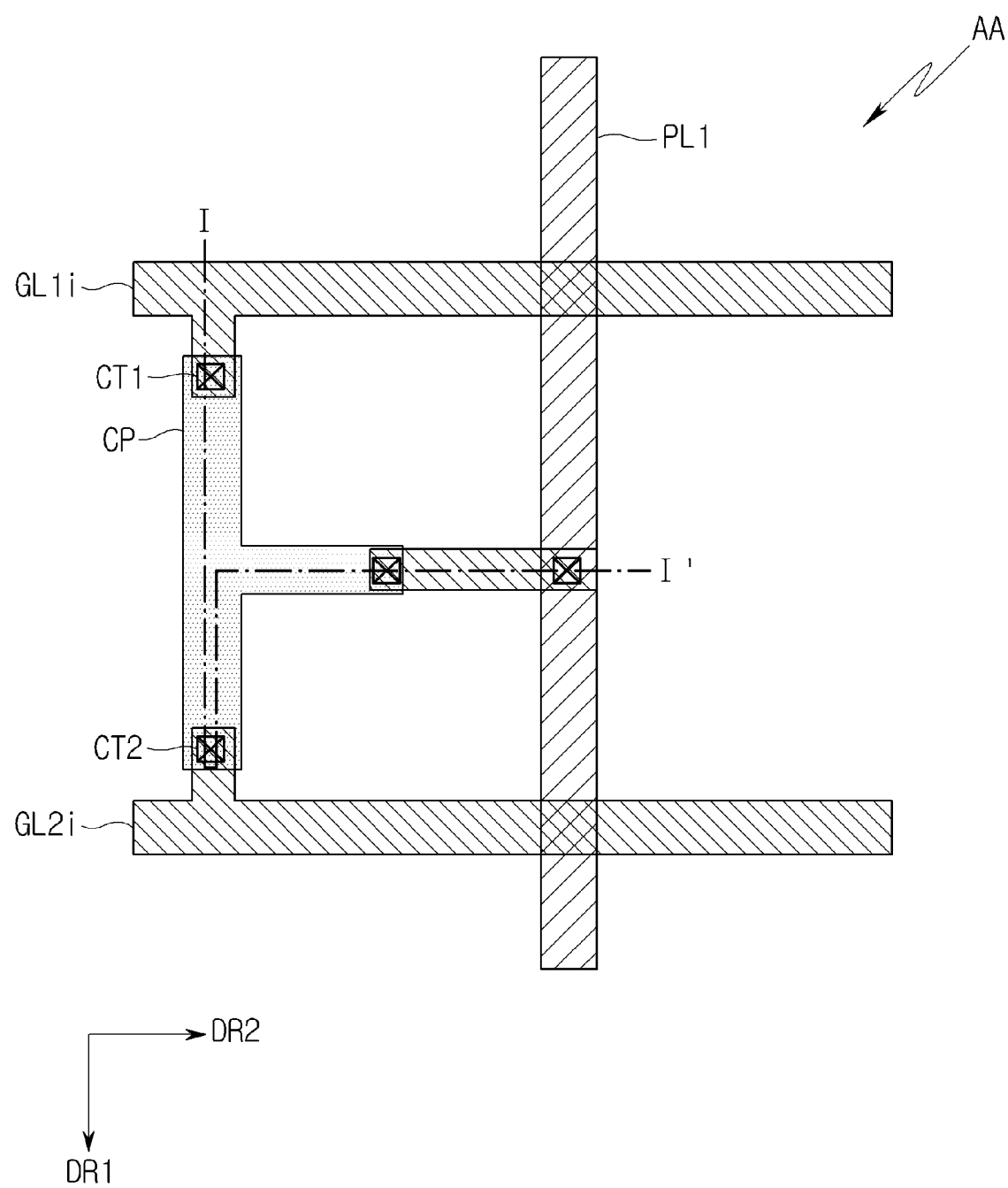
Figure 13:
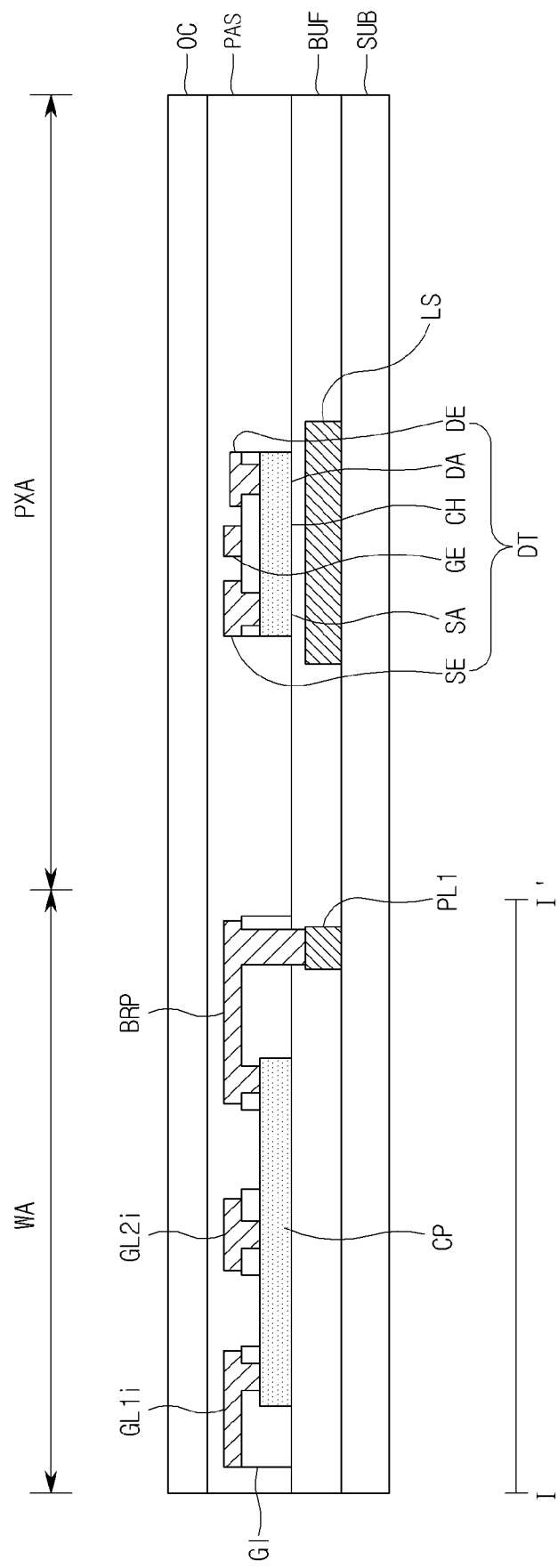

Referring to FIGS. 12 and 13, the second conductive layer may be formed on the gate insulation layer GI. The second conductive layer may include the first and the second gate line GL1i and GL2i and the bridge pattern BRP placed in the wire area WA, and the gate electrode GE, the source electrode SE, and the drain electrode DE placed in the pixel area PXA.

The first and the second gate line GL1i and GL2i are formed in a shape that extends in the second direction DR2. The first and the second gate line GL1i and GL2i are placed spaced apart from each other in the first direction DR1 with the connection pattern CP therebetween.

Herein, at least one region of the first gate line GL1i is formed overlapping the connection pattern CP. For example, the protrusion pattern protruding in the first direction DR1 in a region of the first gate line GL1i may be formed overlapping the connection pattern CP. The first gate line GL1i may be connected to the connection pattern CP through the first contact hole CT1 formed in advance, in an area where the connection pattern CP and the first gate line GL1i overlap.

At least one region of the second gate line GL2i is formed overlapping the connection pattern CP. For example, the protrusion pattern protruding in a direction opposite to the first direction DR1 in a region of the second gate line GL2i may be formed overlapping the connection pattern CP. The second gate line GL2i may be connected to the connection pattern CP through the second contact hole CT2 formed in advance, in an area where the connection pattern CP and the second gate line GL2i overlap.

The bridge pattern BRP is formed in a shape that extends in the second direction DR2 between the connection pattern CP and the first power line PL1. A region of the bridge pattern BRP may be formed overlapping the connection pattern CP, and another region of the bridge pattern BRP may be formed overlapping the first power line PL1. The bridge pattern BRP may be connected to the connection pattern CP through the third contact hole CT3 in an area where the bridge pattern BRP and the connection pattern CP overlap, and may be connected to the first power line PL1 through the fourth contact hole CT4 in an area where the bridge pattern BRP and the first power line PL1 overlap.

As shown in FIGS. 12 and 13, the first and the second gate line GL1i and GL2i and the first power line PL1 are electrically connected to each other through the connection pattern CP and the bridge pattern BRP, and may thus have an equipotential.

The gate electrode GE may be placed overlapping the corresponding channel CH of the active layer ACT. The source electrode SE is connected to the source area SA of the active layer ACT through the contact hole. The drain electrode DE is connected to the drain area DA of the active layer ACT through the contact hole. The gate electrode GE, the source electrode SE, and the drain electrode DE may constitute one transistor. FIG. 13 shows an example of a driving transistor DT of which the drain electrode DE is electrically connected to the anode electrode AE of the light-emitting element LD as described later.

While the first and the second gate line GL1i and GL2i are connected to the first power line PL1 and thus an equipotential is provided, circuit elements such as the driving transistor DT are formed without being damaged by static electricity.

The second conductive layer may be covered by a passivation layer PAS. The passivation layer PAS may cover the second conductive layer, and exposed areas of the buffer layer BUF and the active layer ACT that are not covered by the second conductive layer. The passivation layer PAS may be an insulation film for protecting the lower elements, and may be a silicon oxide film (SiOx), a silicon nitride film (SiNx), or multiple layers of a silicon oxide film (SiOx) and a silicon nitride film (SiNx).

On the passivation layer PAS, an overcoat layer OC may be formed. The overcoat layer OC may be a planarizing film for reducing the difference in level of the lower structure, and may be composed of an organic material such as polyimide, benzocyclobutene series resin, acrylate, and the like.

Figure 14:
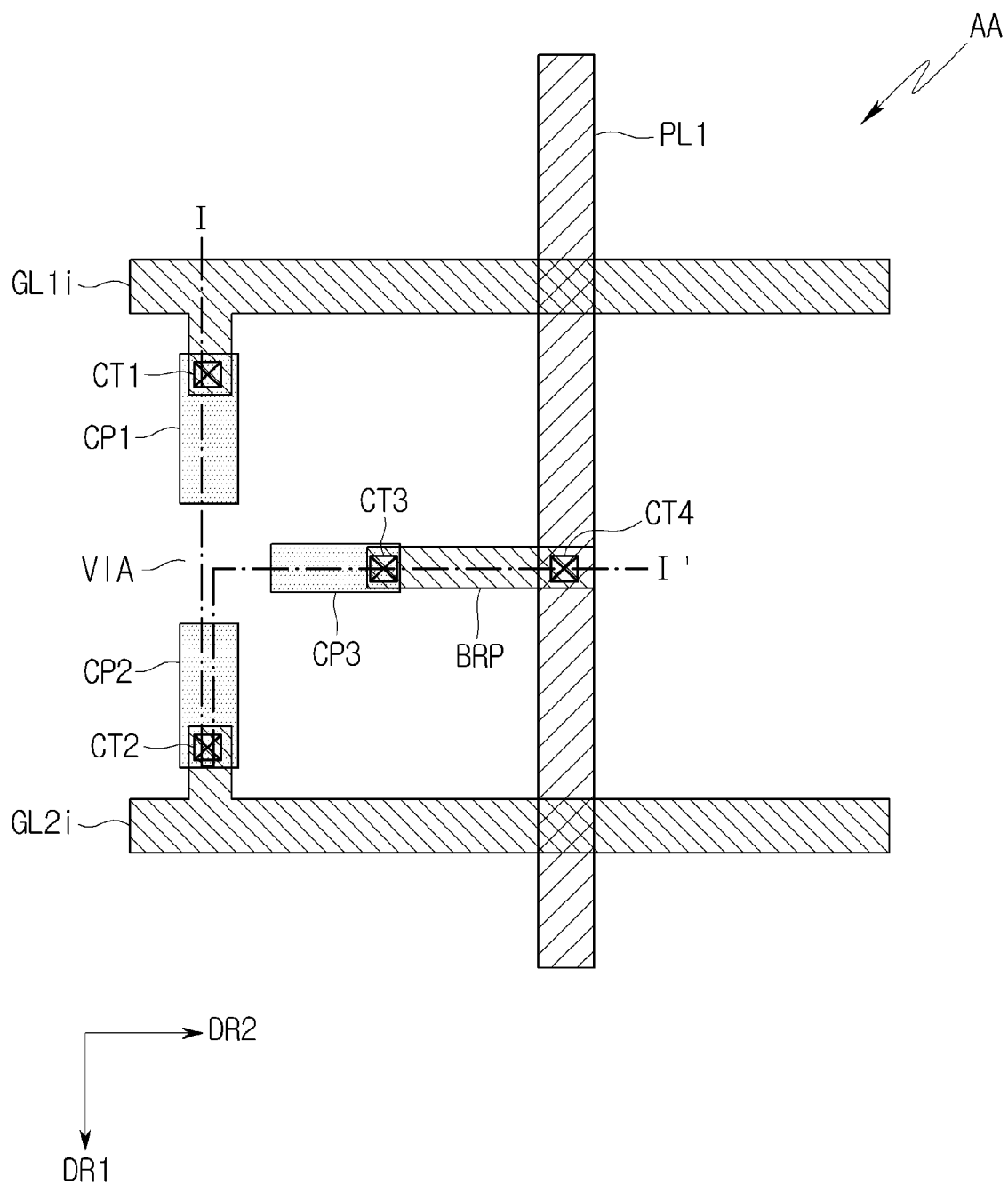
Figure 15:
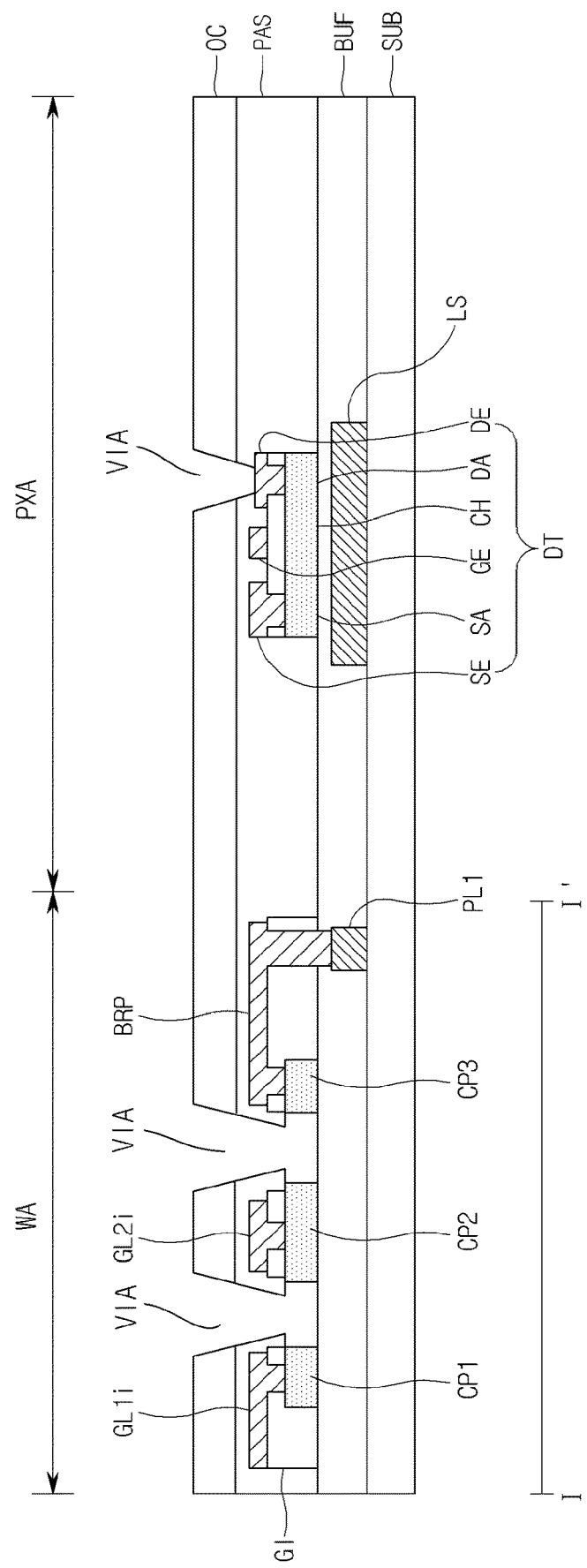

Referring to FIGS. 14 and 15, afterward, a via hole VIA penetrating the overcoat layer OC and the passivation layer PAS is formed. In an embodiment, the passivation layer PAS is formed, and while a mask provided with openings corresponding to via holes VIAs is applied, passivation holes are formed with an etchant that selectively etches a silicon film, and an overcoat layer is formed in a pattern on an area except the passivation holes, thereby forming the via holes VIAs. In another embodiment, the passivation layer PAS and the overcoat layer OC are formed, and while a mask provided with openings corresponding to via holes VIAs covers the layers, an etchant that selectively etches the passivation layer PAS and the overcoat layer OC is applied, thereby forming the via holes VIAs.

A via hole VIA may be an opening for connecting the anode electrode AE of the light-emitting element LD to the drain electrode DE of the driving transistor DT. To this end, the via hole VIA may be formed corresponding to an area where the anode electrode AE is to be placed in the pixel area PXA.

In this embodiment, a via hole VIA may be further formed in the connection pattern CP in the wire area WA. For example, a via hole VIA may be formed in an area except the areas where the first to the third contact hole CT1, CT2, and CT3 are formed. In other words, the via hole VIA may be formed in the node where the first gate line GL1i, the second gate line GL2i, and the first power line PL1 are connected.

The etchant for forming a via hole VIA is made of a material for etching a silicon film. Therefore, when the etchant for forming a via hole VIA is applied to the active layer ACT made of a silicon-based semiconductor material, the active layer ACT is etched. In general, the active layer ACT is thinner than the overcoat layer OC and the passivation layer PAS and has a high reactivity to the etchant, so that the active layer ACT is etched more quickly than the overcoat layer OC and the passivation layer PAS. No other conductive layers are formed on the connection pattern CP. Therefore, when a via hole VIA is formed in the connection pattern CP, the passivation layer PAS is etched, and then the active layer ACT, that is, the connection pattern CP, which is the lower layer, is etched.

When the via hole is formed in the node where the first gate line GL1$i$, the second gate line GL2$i$, and the first power line PL1 are connected, the connection pattern CP around the node is removed, and thus the first gate line GL1$i$, the second gate line GL2$i$, and the first power line PL1 are separated from each other. The remaining portions of the connection pattern CP that are not etched may form the first connection pattern CP1 connected to the first gate line GL1$i$, the second connection pattern CP2 connected to the second gate line GL2$i$, and the third connection pattern CP3 connected to the bridge pattern BRP.

In this embodiment, as described above, an additional process is not required to electrically separate the first gate line GL1$i$, the second gate line GL2$i$, and the first power line PL1 that are in the equipotential state. That is, in this embodiment, when the via hole VIA for electrically connecting the anode electrode AE and the driving transistor DT is formed in the pixel area PXA, a process of forming the via hole VIA in the connection pattern CP is also applied, whereby connection between the first gate line GL1$i$, the second gate line GL2$i$, and the first power line PL1 is separated.

Figure 16:
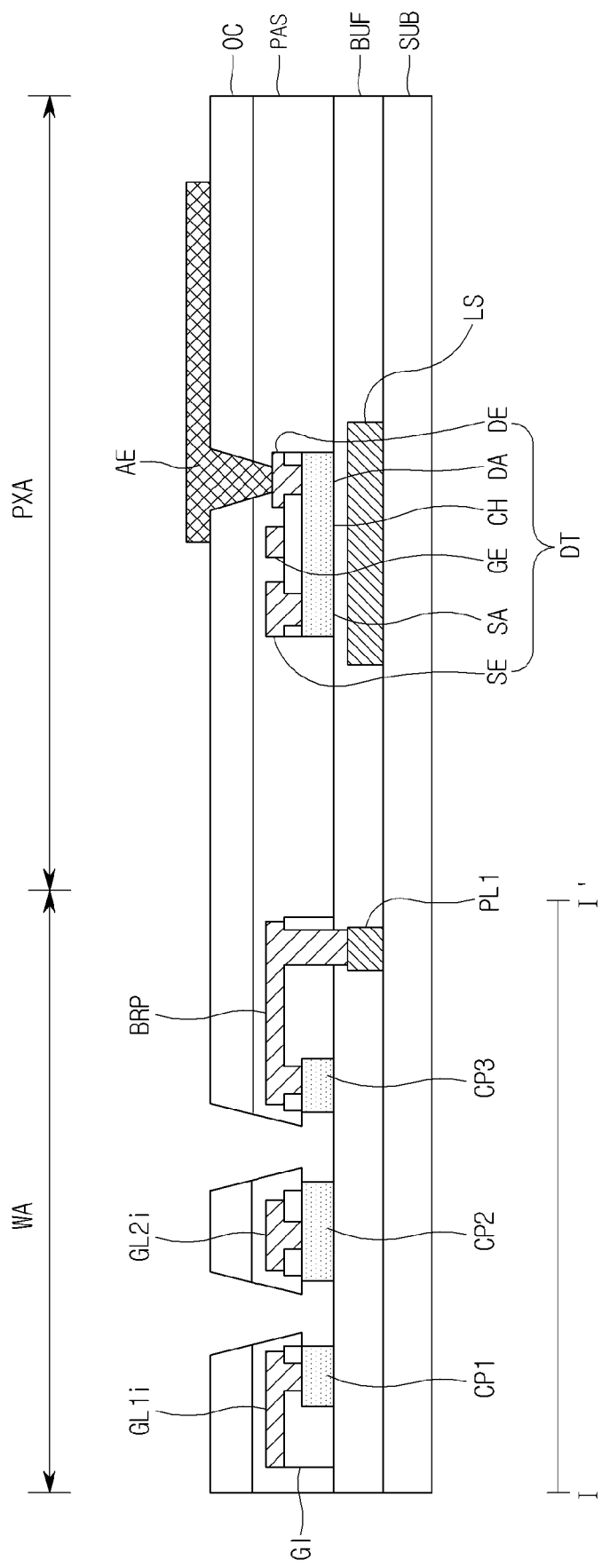

Referring to FIG. 16, the anode electrode AE may be formed in the pixel area PXA. The anode electrode AE may be formed substantially corresponding to the emission area EA within the pixel area PXA.

The anode electrode AE may be electrically connected to the drain electrode DE of the driving transistor DT through the via hole VIA. In the shown embodiment, the anode electrode AE is directly connected to the drain electrode DE through the via hole VIA, but this embodiment is not limited thereto. That is, in various other embodiments, the anode electrode AE may be electrically connected to an electrode of at least one another circuit element or to the drain electrode DE of the driving transistor DT via the connection pattern (the bridge pattern), or the like.

Figure 17:
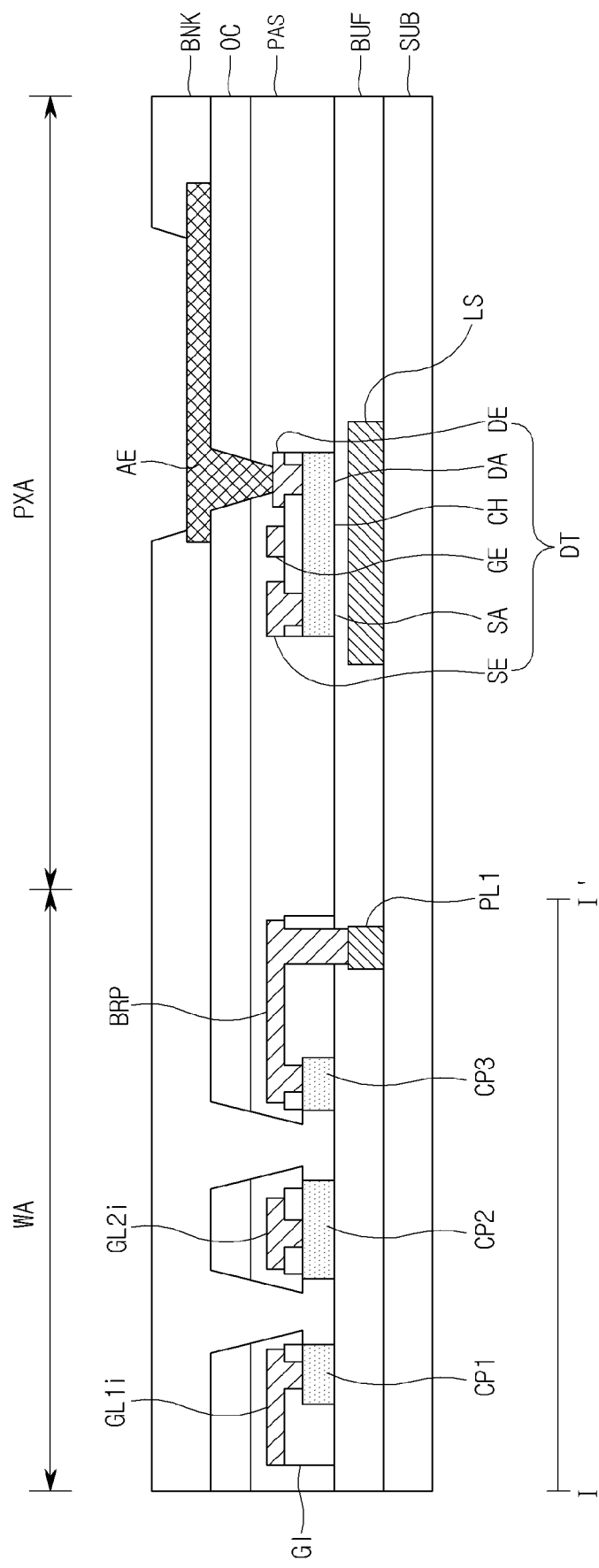

In an embodiment, in the case where the display panel 50 is manufactured in a structure including a bank BNK, a bank BNK may be further formed as shown in FIG. 17. The bank BNK may be a pixel definition film defining the emission area EA of the pixel PX.

The bank BNK is formed to cover an edge area of the anode electrode AE, and the exposed area of the anode electrode AE which is not covered by the bank BNK may be defined as the emission area EA of the pixel PX. In the emission area EA, the anode electrode AE, the emission layer EML, and a cathode electrode CE are stacked in such a manner as to be directly in contact with each other.

The bank BNK may be formed to be wide to the wire area WA. In this embodiment, the via hole formed in the wire area WA may be filled by the bank BNK.

Figure 18:
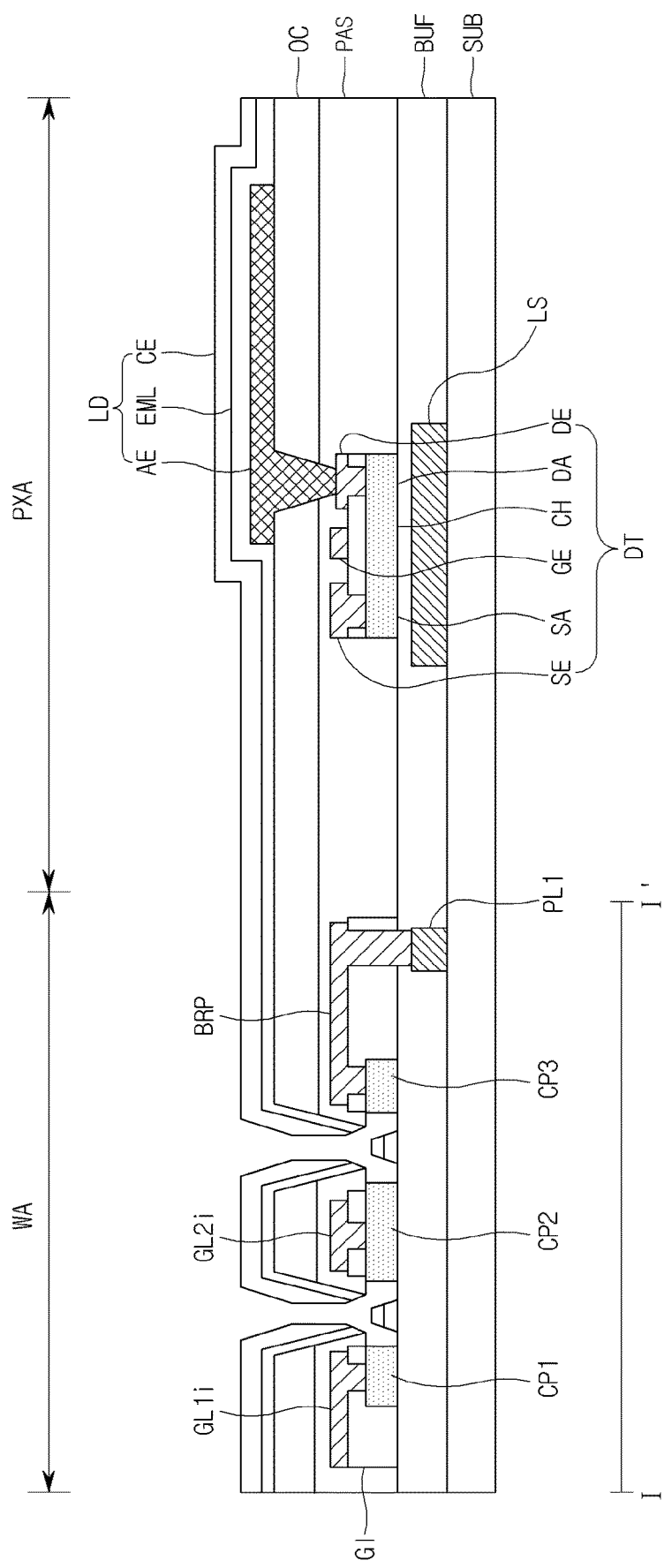
Figure 19:
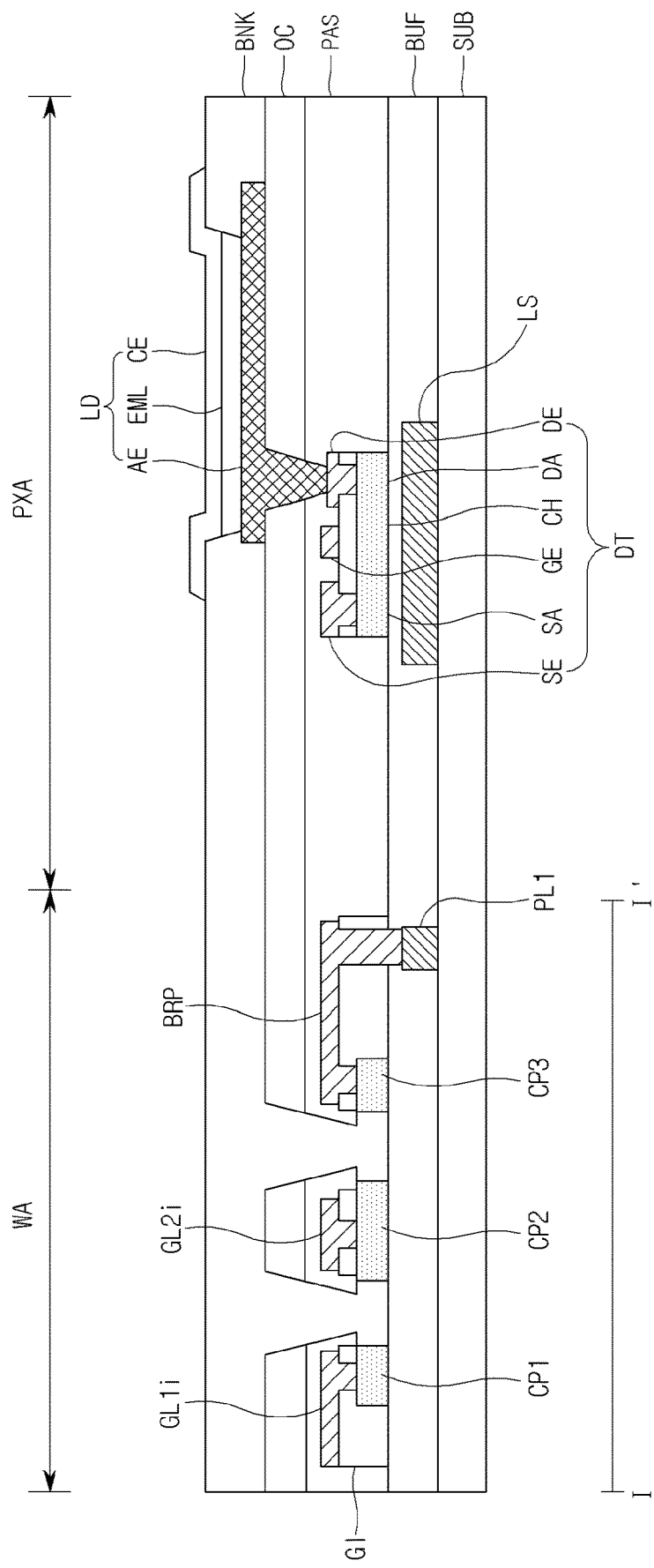

Referring to FIGS. 18 and 19, the emission layer EML and the cathode electrode CE are stacked on the anode electrode AE in that order. In the case where the display panel 50 is manufactured in a bank-less structure not including a bank BNK, the emission layer EML is placed to cover the anode electrode AE as shown in FIG. 18. In the case where the display panel 50 is manufactured in a structure including a bank BNK, the emission layer EML may be formed within the emission area EA surrounded by the bank BNK as shown in FIG. 19.

The emission layer EML may have a multi-layer thin-film structure including a light generation layer. Herein, the color of light generated by the light generation layer may be white, red, blue, green, or the like, but is not limited thereto.

The cathode electrode CE may be formed on the display panel 50 to be wide.

In an embodiment, the emission layer EML may be formed using evaporation deposition. In addition, the cathode electrode CE may be formed by using physics vapor deposition, such as sputtering. However, this embodiment is not limited thereto.

As described above, since the active layer ACT is thinner than the overcoat layer OC and the passivation layer PAS and has a high reactivity to the etchant, the active layer ACT is excessively etched below the passivation layer PAS, resulting in an undercut under the passivation layer PAS. Both the emission layer EML and the cathode electrode CE may be separated at the opposite ends of the via hole in the wire area WA due to the undercuts. The separated areas of the emission layer EML and the separated areas of the cathode electrode CE may be stacked above the buffer layer BUF that is exposed inside the via hole as shown in FIG. 18.

It will be understood by those skilled in the art that the present disclosure can be embodied in other specific forms without changing the technical idea or essential characteristics of the present disclosure. Therefore, it should be understood that the embodiments described above are illustrative in all aspects and not restrictive. The scope of the present disclosure is characterized by the appended claims rather than the detailed description described above, and it should be construed that all alterations or modifications derived from the meaning and scope of the appended claims and the equivalents thereof fall within the scope of the present disclosure.

What is claimed is:

1. A display device comprising:
a substrate including a pixel area in which a pixel is placed, and a wire area in which wires connected to the pixel are placed;
a first power line placed on the substrate, and through which driving power is applied to the pixel;
an active layer including a first connection pattern, a second connection pattern, and a third connection pattern in the wire area, the first connection pattern, the second connection pattern, and the third connection pattern placed above the first power line, and the third connection pattern being connected to the first power line; and
a first gate line directly connected to the first connection pattern through a first contact hole, and a second gate line directly connected to the second connection pattern through a second contact hole, the first gate line and the second gate line being placed on the active layer in the wire area,
wherein the first connection pattern, the second connection pattern, and the third connection pattern are island-shaped electrodes, and
wherein the first connection pattern, the second connection pattern, and the third connection pattern are disposed on a same layer and comprise a same material.

2. The display device of claim 1, wherein the first power line extends in a first direction, and
the third connection pattern has a shape of a bar that extends in a second direction perpendicular to the first direction.

3. The display device of claim 2, wherein the first gate line and the second gate line are placed spaced apart from each other in the first direction, and extend in the second direction, and
the first connection pattern and the second connection pattern each have a shape of a bar extending in the first direction.

4. The display device of claim 3, wherein each of the first connection pattern, the second connection pattern, and the third connection pattern are provided with a first end that is connected to the first gate line, the second gate line, and the first power line, respectively, and with a second end that is placed adjacent to other connection patterns.

5. The display device of claim 4, wherein the first connection pattern, the second connection pattern, and the third connection pattern are placed between the first gate line and the second gate line.

6. The display device of claim 5, wherein the first connection pattern and the second connection pattern are placed spaced apart from each other in the first direction, and
the third connection pattern is placed spaced apart from the first connection pattern and the second connection pattern in the first direction and the second direction.

7. The display device of claim 4, wherein the first gate line has a region provided with a protrusion pattern protruding toward the first connection pattern, and an end of the protrusion pattern is connected to the first connection pattern.

8. The display device of claim 4, wherein the second gate line has a region provided with a protrusion pattern protruding toward the second connection pattern, and an end of the protrusion pattern is connected to the second connection pattern.

9. The display device of claim 4, further comprising:
a bridge pattern connected to the first power line and the third connection pattern,
wherein the first power line is electrically connected to the third connection pattern through the bridge pattern.

10. The display device of claim 9, wherein the bridge pattern has a shape of a bar that extends from the third connection pattern to the first power line in the second direction.

11. The display device of claim 9, further comprising:
a buffer layer interposed between the first power line and the active layer;
a gate insulation layer interposed between the active layer, and the first gate line and the second gate line;
a passivation layer covering the first gate line and the second gate line;
an overcoat layer covering the passivation layer; and
an anode electrode placed on the overcoat layer in the pixel area,
wherein the first connection pattern and the second connection pattern are respectively connected to the first gate line and the second gate line through the first contact hole and the second contact hole penetrating the gate insulation layer,
the third connection pattern is connected to the bridge pattern through a third contact hole penetrating the gate insulation layer, and
the bridge pattern is connected to the first power line through a fourth contact hole penetrating the buffer layer and the gate insulation layer.

12. The display device of claim 11, further comprising:
an emission layer covering the anode electrode; and
a cathode electrode covering the emission layer.

13. The display device of claim 11, further comprising:
a bank layer placed on the overcoat layer, and covering an edge of the anode electrode;
an emission layer formed in an exposed area of the anode electrode that is not covered by the bank layer; and
a cathode electrode covering the bank layer and the emission layer.

14. A display device comprising:
a substrate including a pixel area in which a pixel is placed, and a wire area in which wires connected to the pixel are placed;
a first power line placed on the substrate, and through which driving power is applied to the pixel;
an active layer including a first connection pattern, a second connection pattern, and a third connection pattern in the wire area, the first connection pattern, the second connection pattern, and the third connection pattern placed above the first power line, and the third connection pattern being connected to the first power line;
a first gate line directly connected to the first connection pattern through a first contact hole, and a second gate line directly connected to the second connection pattern through a second contact hole, the first gate line and the second gate line being placed on the active layer in the wire area; and
a passivation layer covering the first gate line and the second gate line and including a via hole that penetrates through the passivation layer,
wherein the first connection pattern, the second connection pattern, and the third connection pattern are island-shaped electrodes;
wherein the first connection pattern, the second connection pattern, and the third connection pattern are disposed on a same layer and comprise a same material; and
wherein the via hole is formed corresponding to at least one region of the first, the second and the third connection pattern.

15. The display device of claim 14, wherein when the via hole is formed, the passivation layer is etched and is thus exposed to outside, and the at least one region of the first, the second and the third connection pattern is partially removed by an etchant in an area corresponding to the via hole.

16. The display device of claim 15, further including:
a gate insulation layer covering the first, the second and the third connection patterns and including a first contact hole, a second contact hole, and a third contact hole that partially expose a first area, a second area, and a third area of the first, the second, and the third connection pattern, respectively,
wherein the first gate line connected to the first connection pattern through the first contact hole, the second gate line connected to the second connection pattern through the second contact hole, and a bridge pattern connected to the third connection pattern through the third contact hole; and
wherein the via hole is formed corresponding to a node where the first area, the second area, and the third area of the first, the second and the third connection pattern are connected.

* * * * *